United States Patent
Maurya et al.

(10) Patent No.: US 9,773,967 B2
(45) Date of Patent: Sep. 26, 2017

(54) PROCESSING METHOD FOR GRAIN-ORIENTED LEAD-FREE PIEZOELECTRIC $NA_{0.5}BI_{0.5}TIO_3$—$BATIO_3$ CERAMICS EXHIBITING GIANT PERFORMANCE

(71) Applicant: Virginia Tech Intellectual Properties, Inc., Blacksburg, VA (US)

(72) Inventors: Deepam Maurya, Blacksburg, VA (US); Shashank Priya, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 532 days.

(21) Appl. No.: 14/068,687

(22) Filed: Oct. 31, 2013

(65) Prior Publication Data

US 2014/0239774 A1    Aug. 28, 2014

Related U.S. Application Data

(60) Provisional application No. 61/737,881, filed on Dec. 17, 2012.

(51) Int. Cl.

| | | |
|---|---|---|
| *H01L 41/20* | (2006.01) | |
| *H01L 41/047* | (2006.01) | |
| *H01L 41/16* | (2006.01) | |
| *H01L 41/187* | (2006.01) | |
| *C04B 35/462* | (2006.01) | |
| *C04B 35/475* | (2006.01) | |
| *H01L 41/43* | (2013.01) | |
| *H01L 41/083* | (2006.01) | |

(52) U.S. Cl.
CPC ............ *H01L 41/16* (2013.01); *C04B 35/462* (2013.01); *C04B 35/475* (2013.01); *H01L 41/187* (2013.01); *C04B 2235/3201* (2013.01); *C04B 2235/3215* (2013.01); *C04B 2235/3234* (2013.01); *C04B 2235/3236* (2013.01); *C04B 2235/3298* (2013.01); *C04B 2235/5276* (2013.01); *C04B 2235/5296* (2013.01); *C04B 2235/787* (2013.01); *C04B 2235/80* (2013.01); *H01L 41/083* (2013.01); *H01L 41/43* (2013.01); *Y10T 428/325* (2015.01)

(58) Field of Classification Search
CPC . H01L 41/1871; H01L 41/1873; H01L 41/39; C04B 35/4682; C04B 35/4686; C04B 35/803; C04B 2235/5276; C04B 2235/5292; C04B 2235/5296

See application file for complete search history.

(56) References Cited

PUBLICATIONS

Zhao et al, "Fabrication of Na0.5Bi0.5TiO3—BaTiO3-Textutured Ceramics Templated by Plate-like Na0.5Bi0.5TiO3 Particles", J. Am. Ceram. Soc., 92 [7], Jul. 2009, pp. 1607-1609.*
Maurya et al, "Enhanced piezoelectrictrity and nature of electric-filed induced structural phase transformation in textured lead-free piezoelectric Na0.5Bi0.5TiO3—BaTiO3 ceramics", App. Phys. Lett, 100, Apr. 2012, pp. 172906-1 to 172906-5.*
Messing et al, "Templated Grain Growth of Textured Piezoelectric Ceramics", Critical Review in Solid State and Materials Science, 29, 2004, pp. 45-96.*
Maurya, D., et al., "Enhanced piezoelectricity and nature of electric-field induced structural phase transformation in textured lead-free piezoelectric Na0.5Bi0.5TiO3—BaTiO3 ceramics", Appl. Phys. Lett, 2012, 100, 172906, 6 pages.
Maurya, D., et al., "Nanostructured lead-free ferroelectric Na0.5Bi0.5TiO3—BaTiO3 whiskers: synthesis mechanism and structure", Dalton Trans., 2012, 41, 5643-5652.
Maurya, D., et al., "Synthesis and Characterization of Na2Ti6O13 Whiskers and their Transformation to (1 x) Na0.5Bi0.5TiO3—xBaTiO3 Ceramics", J. Am. Ceram. Soc., 2011, 94 (9), pp. 2857-2871.
Maurya, D., et al., "Synthesis mechanism of grain-oriented lead-free piezoelectric Na0.5Bi0.5TiO3—BaTiO3 ceramics with giant piezoelectric response", J. Mater. Chem. C, 2013, 1, 2102-2111.
Messing, G. L., et al., "Templated Grain Growth of Textured Piezoelectric Ceramics" Critical Review in Solid State and Materials Sciences, 2004, 29, pp. 45-96.
Rodel, J., et al., "Perspective on the Development of Lead-free Piezoceramics", J. Am. Ceram. Soc., 2009, 92 (6), pp. 1153-1177.
Saito, Y., et al., "Lead-free piezoceramics", Nature, 2004, 432, pp. 84-87.
Takenaka, T., et al., "(Bi0.5Na0.5)TiO3—BaTiO3 System for Lead-Free Piezoelectric Ceramics", Jpn J. Appl. Phys., 1991,30 (9B), pp. 2236-2239.

* cited by examiner

*Primary Examiner* — Carol M Koslow
(74) *Attorney, Agent, or Firm* — NRV IP Law, PC; Michele L. Mayberry

(57) ABSTRACT

Textured ceramic compositions having improved piezoelectric characteristics as compared with their random counterparts are provided. Methods of making the compositions and devices using them are also included. More particularly, compositions comprising textured ceramic $Na_{0.5}Bi_{0.5}TiO_3$—$BaTiO_3$(NBT-BT) materials synthesized from high aspect ratio NBT seeds exhibit improved characteristics, including an increased longitudinal piezoelectric constant ($d_{33}$) and magnetoelectric coupling coefficient over randomly oriented NBT-BT. Additionally provided are compositions comprising of nanostructured $Na_{0.5}B_{0.5}TiO_3$—$BaTiO_3$ ferroelectric whiskers having a high aspect ratio. Nanostructured whiskers can be used to improve the piezoelectric properties of the bulk ceramics. The inventive materials are useful in microelectronic devices, with some finding particular application as multilayer actuators and transducers.

15 Claims, 20 Drawing Sheets

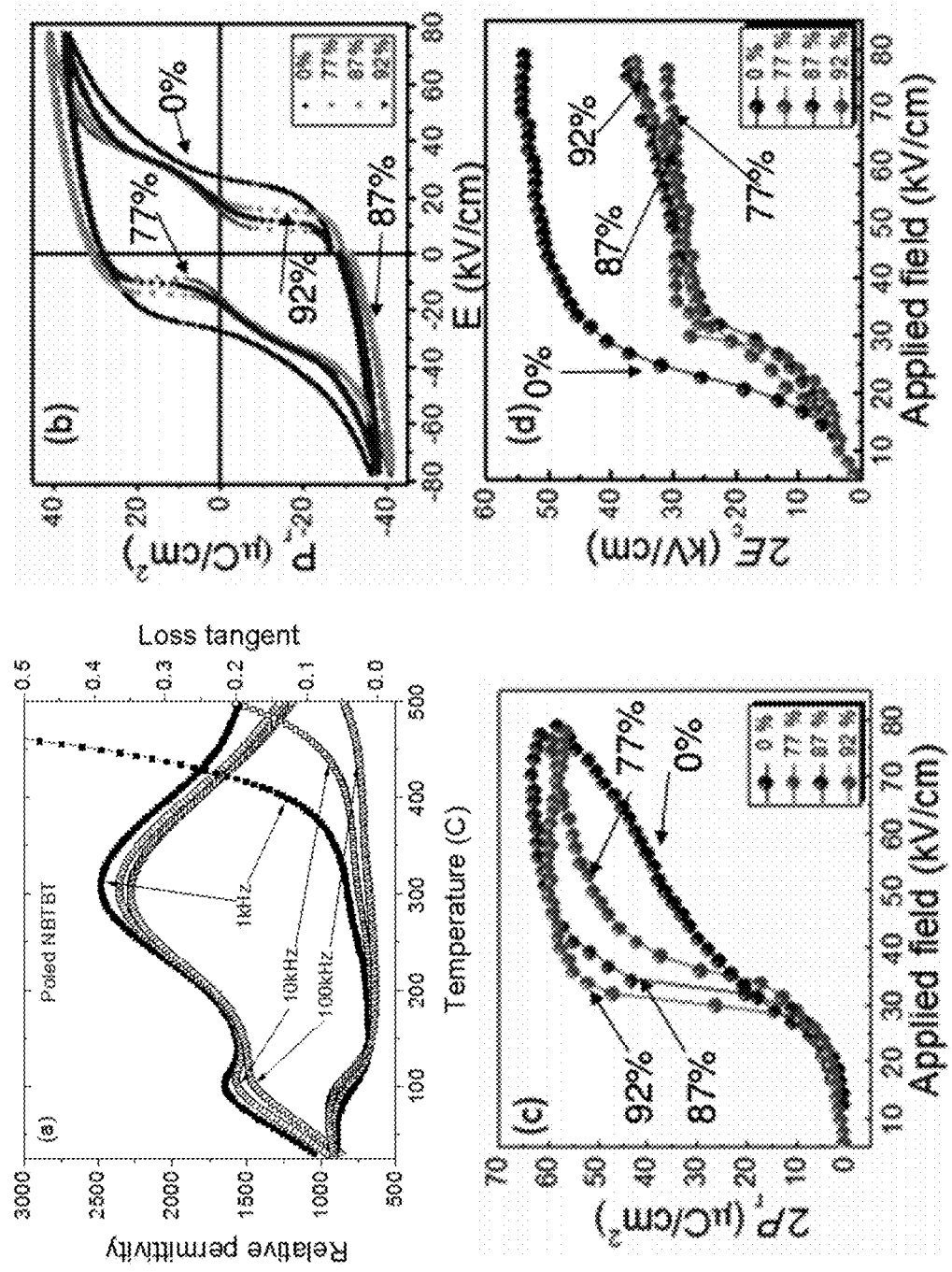
FIGS. 2A-D

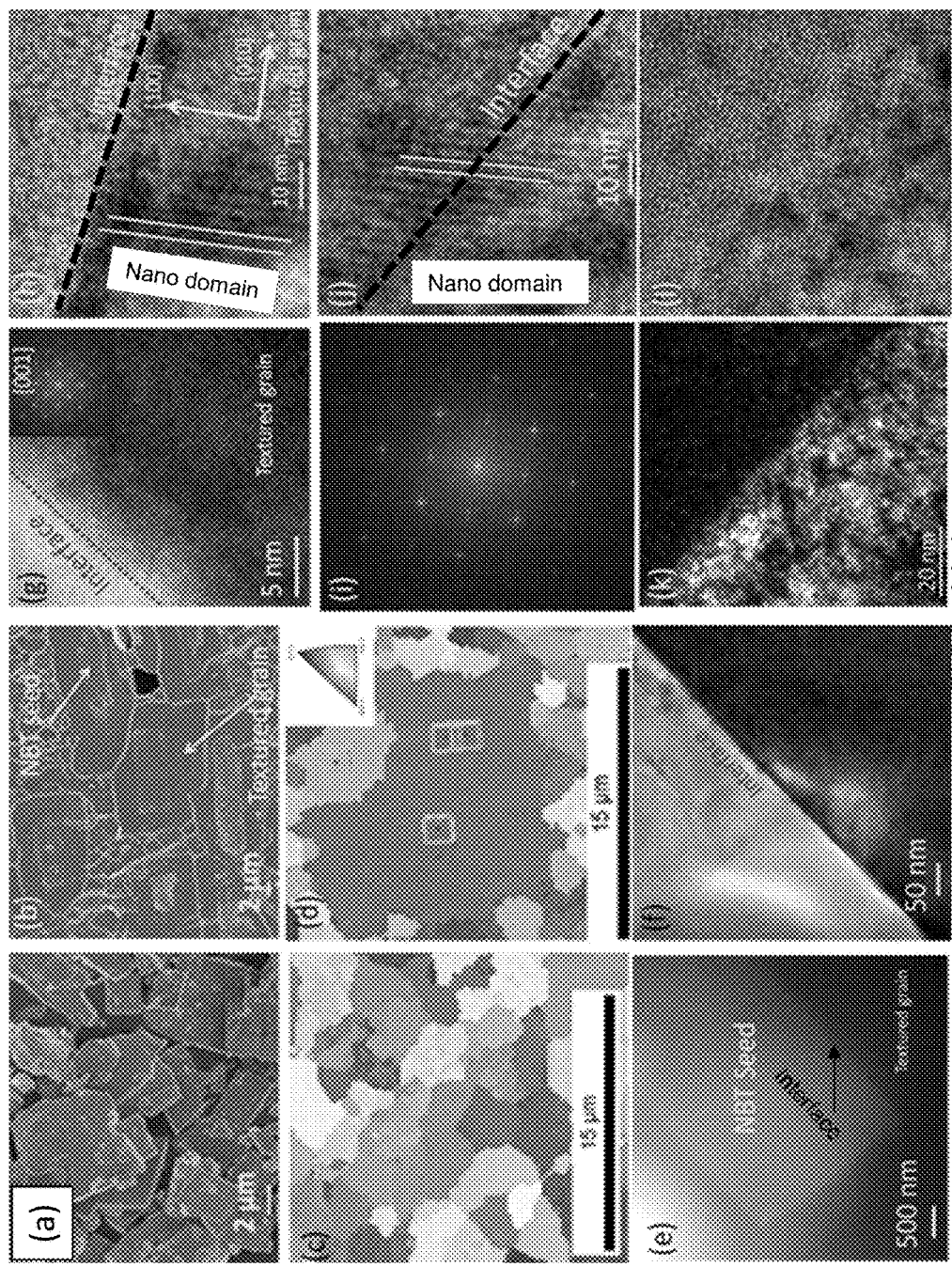
FIGS. 4A-L

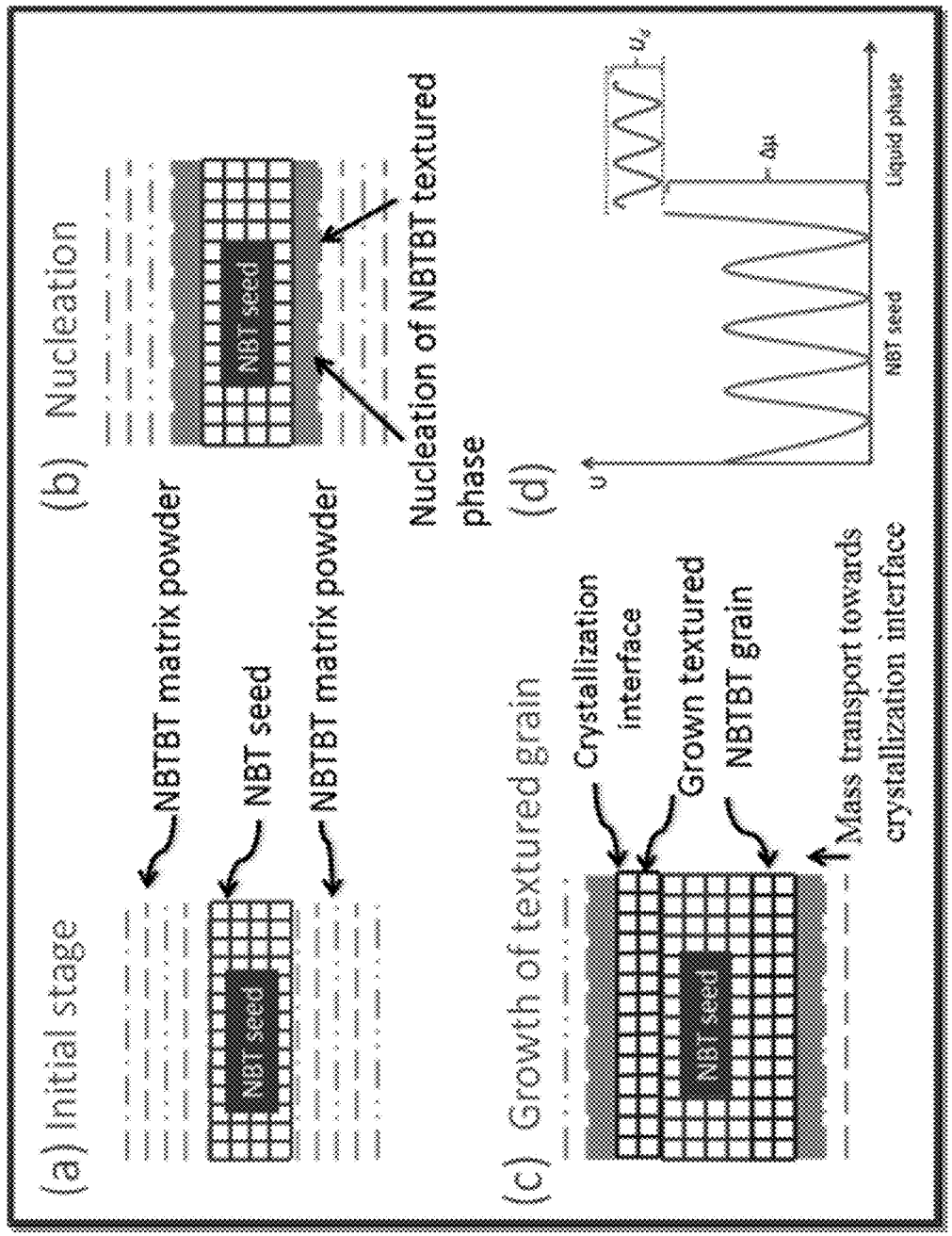
FIGS. 5A-D

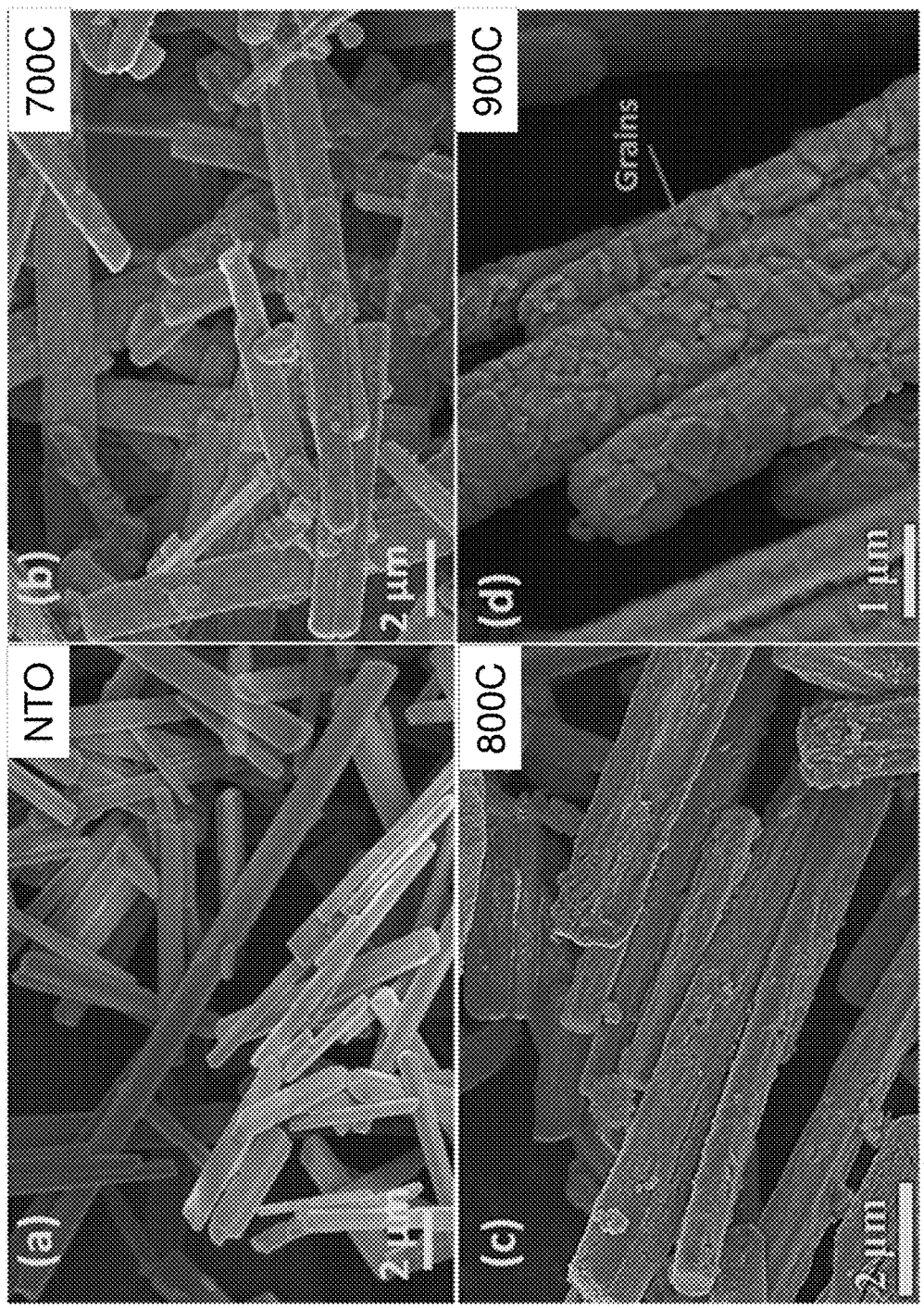
FIGS. 7A-D

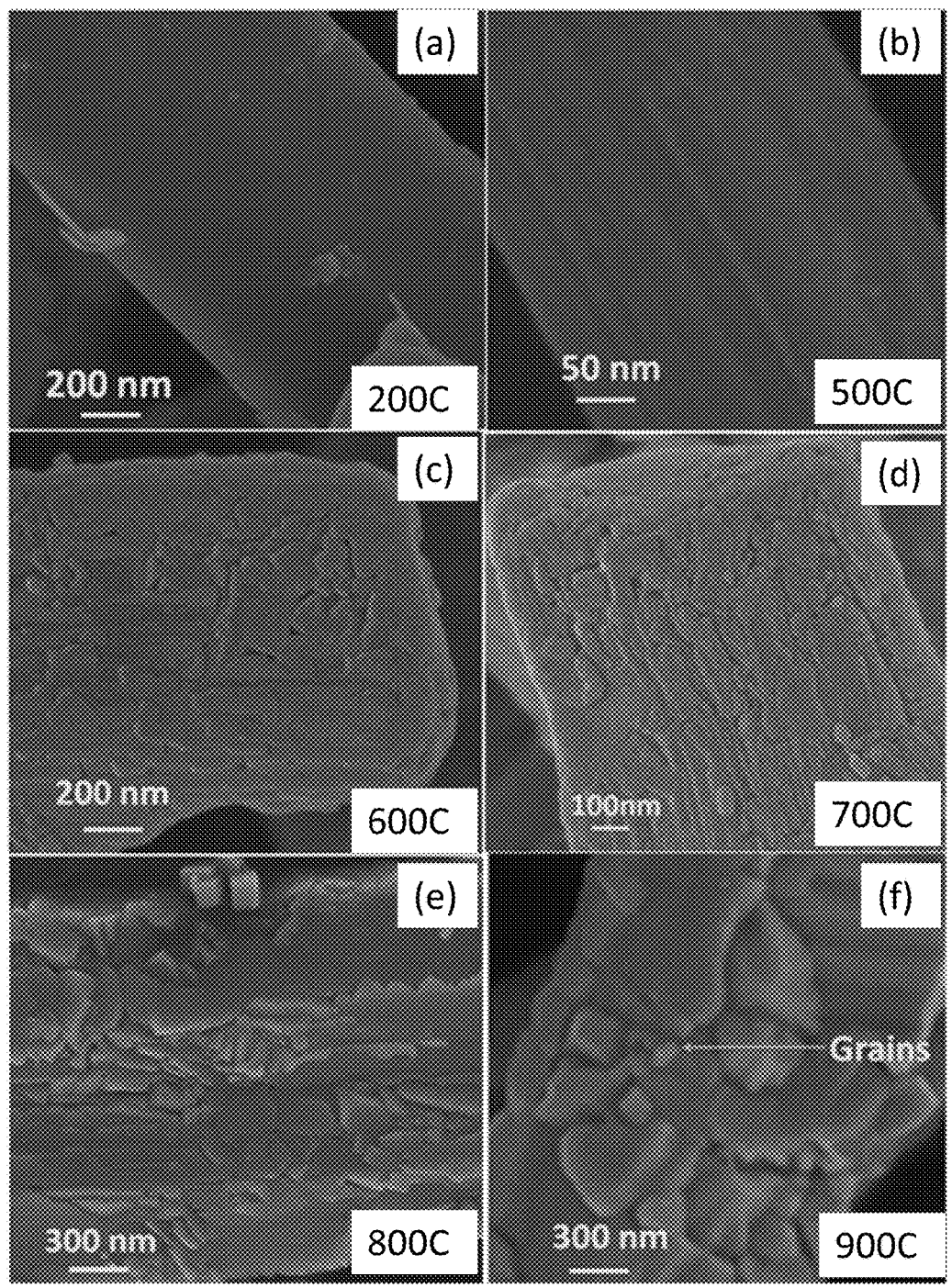
FIGS. 8A-F

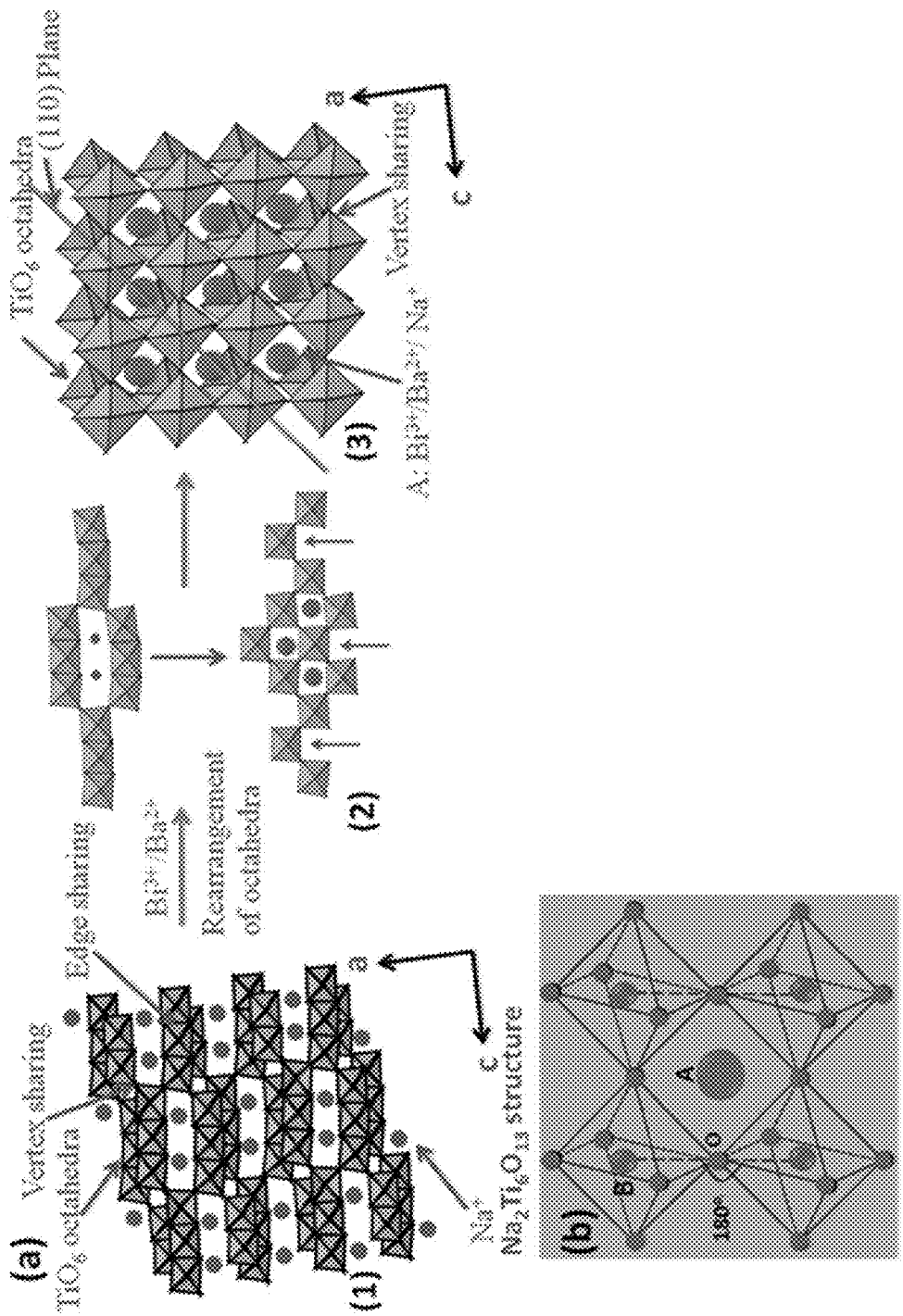
FIGS. 9A-B

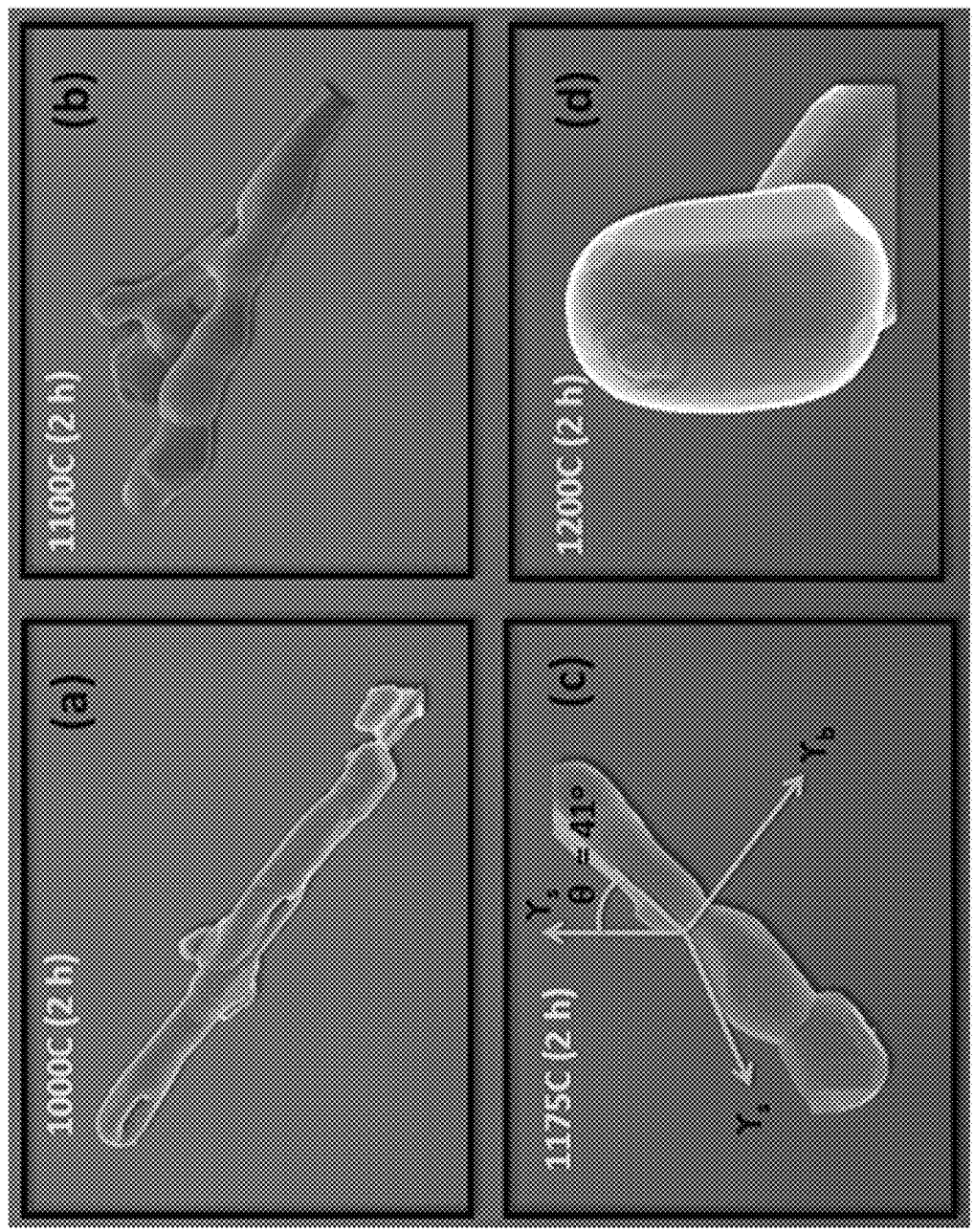
FIGS. 10A-D

PROCESSING METHOD FOR GRAIN-ORIENTED LEAD-FREE PIEZOELECTRIC $NA_{0.5}BI_{0.5}TIO_3$—$BATIO_3$ CERAMICS EXHIBITING GIANT PERFORMANCE

CROSS REFERENCE TO RELATED APPLICATIONS

This application claims priority to and the benefit of the filing date of U.S. Provisional Application No. 61/737,881, filed Dec. 17, 2012, the disclosure of which is hereby incorporated by reference herein in its entirety.

STATEMENT OF GOVERNMENT INTEREST

This invention was made with government support under Grant No. DMR0806592 and Grant No. IIP1035042 awarded by the National Science Foundation. The government has certain rights in the invention.

BACKGROUND OF THE INVENTION

Field of the Invention

The present invention relates to the field of piezoelectric materials. More particularly, embodiments of the present invention relate to lead-free ceramic piezoelectric materials. Further embodiments provide a textured lead-free piezoelectric ceramic comprising of the system $(Na_{0.5}Bi_{0.5}TiO_3)$—$BaTiO_3$ (NBTBT) that uses $Na_{0.5}Bi_{0.5}TiO_3$ (NBT) platelets as template seeds.

Description of Related Art

Piezoelectric materials find applications in a multitude of commonly used devices such as sensors, actuators and energy harvesters. However, most of these piezoelectric materials utilize lead-based compositions which are becoming a serious environmental problem owing to the restrictions imposed by regulatory agencies across the globe. See J. Rodel, W. Jo, K. T. P. Seifert, Eva-Maria Anton, T. Granzow and D. Damjanovic, J. Am. Ceram. Soc., 2009, 92, 1153. In the functional ceramics community, there is no problem more important than to find the replacement for lead-based piezoelectrics used for actuators. However, the electromechanical properties of actuators (high piezoelectric constant, high coupling factor, low loss, and high transition temperatures) for known lead-free compositions are far inferior to those of lead-based systems. See T. R. Shrout and S. J. Zhang, J. Electroceram., 2007, 19, 111.

Currently, there are two lines of thought for addressing this fundamental problem—(i) search for new compositions through computational models and experimental approaches (doping, solid solutions having morphotropic (M) or polymorphic (P) phase boundary (PB), and metastable phases in phase diagram), and/or (ii) improve the properties of known compositions through microstructural engineering and multilayering; where improving known compositions has been increasing in popularity.

The $(Na_{0.5}Bi_{0.5}TiO_3)$—$BaTiO_3$ (NBTBT) system has emerged as a potential candidate to replace lead-based piezoelectrics out of the various possibilities for lead-free systems. See Ben Wylie-van Eerd, Dragan Damjanovic, Naama Klein, Nava Setter, and Joe Trodahl, Phys. Rev. B, 2010, 82, 104112; Deepam Maurya, Cheol-Woo Ahn and Shashank Priya, Advances in Electroceramic Materials II: Ceramic Trans., 2010, 221, 47; Deepam Maurya, M. Murayama and Shashank Priya, J. Am. Ceram. Soc., 2011, 94, 2857 ("Deepam 2011"). A variety of research efforts have been pursued in literature towards improving the piezoelectric response of NBTBT. Most of these techniques, however, have been found to show limited success. See T. Takenaka, K. Maruyama, K Sakata, Jpn J. Appl. Phys., 1991, 30, 2236; P Fu, Z. Xu, R. Chu, W. Li, G. Zang, J. Hao, Mater. Sci. Engg. B, 2010, 167, 161; H. Li, C. Feng, P. Xiang, Jpn. J. Appl. Phys., 2003, 42, 7387; H. Li, C. Feng, W. Yao, Mater. Lett., 2004, 58, 1194; W. Lang, D. Xiao, L. Dunmin, Z. Jianguo, Y. Ping, L. Xiang, Jpn. J. Appl. Phys., 2007, 46, 7382; R. Zuo, C. Ye, X. Fang, J. Li, J. Eur. Ceram. Soc., 2008, 28, 871; X. X. Wang, H. Chan, C. L. Choy, Appl. Phys. A: Mater. Sci. Process., 2005, 80, 333; M. S. Yoon, Y. G. Lee, S. C. Ur, J. Electroceram., 2009, 23, 564. Driving the material through electric-field induced phase transformation in compositions of NBTBT that exhibit structural instabilities can provide large strain but this is not practical for applications due to the intrinsic non-linear behavior and high amplitude of electric drive.

It is known that the piezoelectric properties of perovskites can be drastically enhanced by imparting crystallographic texture, a process known as texturing. See Y. Saito, H. Takao, T. Tani, T. Nonoyama, K. Takatori, T. Homma, T. Nagaya and M. Nakamura, Nature, 2004, 432, 84 ("Y. Saito"); See S. Kwon, E. M. Sabolsky, G. L. Messing, S. Trolier-McKinstry, J. Am. Ceram. Soc., 2005, 88, 312 ("S. Kwon"). Texturing enables the polycrystalline ceramics to resemble their single crystal counterparts so that favorable domain engineered states can be obtained. However, texturing of lead-free compositions is an extremely challenging problem due to several fundamental constraints such as volatility of alkali elements, chemical reactivity with seed templates, poor sinterability of the base compositions, and cubical equilibrium grain shape.

Therefore, there exists a need to provide a lead-free ceramic material that still maintains the desired characteristics comparable to ceramics containing lead. Moreover, there exists a need of improving the method through which synthesis of textured lead-free ceramic compositions can be conducted in order to provide piezoelectric properties that closely mimic domain engineered single crystals.

SUMMARY OF THE INVENTION

The present invention relates generally to piezoelectric materials, and more particularly to lead free, ceramic based piezoelectric materials.

In certain embodiments, the present invention provides a synthesized, textured lead-free piezoelectric. Further, embodiments comprise $(Na_{0.5}Bi_{0.5}TiO_3)$—$BaTiO_3$ (NBTBT) that uses NBT platelets as template seed. The textured specimen shows improvement in longitudinal piezoelectric constant ($d_{33}$) and magnetoelectric coupling coefficient. Additionally, embodiments of the invention provide >90% grain oriented ceramics with 100% improvement in piezoelectric properties over the prior art to overcome the previously described challenges.

Embodiments range in percentage of grain oriented ceramics and include 90-100% grain oriented ceramics and more specifically include 90%, 91%, 92%, 93%, 94%, 95%, 96%, 97%, 98%, 99% and 100% polycrystalline orientation. The present invention focuses attention on discovering microstructures that can provide giant enhancement in piezoelectric response. The texturing technique described here can be applied to any other material system to achieve similar piezoelectric enhancement.

Object 1 of the invention provides compositions comprising of an NBTBT ceramic with NBT seeds oriented within the ceramic to a desired degree, wherein the NBT seeds have an aspect ratio of greater than 1. Preferred are such compositions that can have NBT seeds with an aspect ratio ranging from about 2-20.

Object 2 of the invention provides compositions of Object 1, wherein the NBTBT ceramic is formed from an NBTBT matrix comprising of an NBT:BT ratio from 80:20 to 99:1. Preferred compositions comprise of an NBT:BT ratio of 80:20 or 70:30 or 60:40. Said another way, compositions of the invention can comprise (1-x)Bi0.5Na0.5TiO$_3$-xBaTiO$_3$ type NBTBT, wherein x ranges from between 0-1, such as 0.02, 0.03, 0.04, 0.05, 0.06, 0.07, 0.08, 0.09, or 0.10, preferably. In embodiments, and said another way, such compositions can comprise NBT in the NBTBT matrix at about 93% and BT in the NBTBT matrix at about 7%.

Object 3 of the invention comprises compositions of Objects 1 or 2, wherein the NBTBT ceramic is of the formula Na$_{0.5}$Bi$_{0.5}$TiO$_3$—BaTiO$_3$(NBTBT).

Object 4 of the invention provides compositions of Objects 1-3, wherein the NBT seeds are oriented within the composition to a degree of greater than 90%. Especially preferred are such compositions with a degree of orientation measured by the Lotgering method of about 92-99%, such as from 93-98%, or from 94-96% for example.

Object 5 provides compositions of Objects 1-4, which have a longitudinal piezoelectric constant d$_{33}$ that is at least 1.5, such as twice, that of a random oriented NBTBT with the same chemical formula. Such compositions preferably comprise a longitudinal piezoelectric constant d$_{33}$ ranging from about 100-500 pC/N.

Object 6 provides compositions of Objects 1-5, which further comprise an electrode chosen from silver, gold, palladium, or platinum, or their alloys.

Object 7 provides compositions of Objects 1-6, wherein the NBT seeds have an aspect ratio of from 2-50, such as from 5-20, or about 2-10. Such compositions can be synthesized by topochemical conversion from Bi$_4$Ti$_3$O$_{12}$ (BIT) platelets using a molten salt synthesis to achieve the desired high aspect ratio crystallites.

Object 8 provides embodiments of the invention comprising multilayer piezoelectric/magnetostrictive composites. Such composites can comprise a piezoelectric layer of an NBTBT ceramic with NBT seeds oriented within the ceramic to a desired degree, wherein the NBT seeds have an aspect ratio of greater than 1 and can comprise at least one magnetostrictive layer. The aspect ratio of the NBT seeds in these embodiments (including a trilayer composite for example) can be to any degree such as those listed above for other Objects of the invention. In particular embodiments, a composite is provided which is a trilayer composite comprising three layers with a piezoelectric/magnetostrictive/piezoelectric configuration. Multilayer actuators can be made from these composites, especially comprising internal electrodes, such as silver.

Object 9 provides composites of Object 8, wherein one or more of the magnetostrictive layers is chosen from Terfenol-D or Galfenol, ferrite such as nickel copper zinc ferrite (NCZF), or Metglas.

Object 10 provides composites of Objects 8 or 9, which have a magnetoelectric coupling coefficient that is at least two times, such as three times, that of a random oriented NBTBT with the same chemical formula.

Object 11 provides composites of Objects 8-10, wherein the NBT seeds are oriented within the ceramic to a degree of greater than 90%, such as from 92-99%. In the context of this specification one technique for measuring the degree of orientation (level to which the planar crystallographic faces are aligned in the same or substantially the same plane) is by the Lotgering method. Other quantitative and/or qualitative techniques can also be used.

Object 12 provides composites of Objects 8-11, wherein the NBTBT ceramic is of the formula Na$_{0.5}$Bi$_{0.5}$TiO$_3$—BaTiO$_3$ (NBTBT).

Object 13 of the invention further provides methods of making the compositions, composites, and other devices of the invention. One such method of making an NBTBT piezoelectric ceramic material is provided comprising: (a) providing an NBTBT matrix; (b) combining NBT seed crystallites with an aspect ratio of greater than 1 with the matrix; (c) orienting the NBT seed crystallites within the matrix to a desired degree; and (d) heating the NBTBT matrix and NBT seed crystallites to obtain a piezoelectric ceramic. Other details of methods of making these materials are provided below. In embodiments, the aspect ratio of the NBT seeds can range from about 2-20, preferably, and even up to about 50.

Object 14 provides methods of Object 13, wherein the piezoelectric ceramic is of the formula Na$_{0.5}$Bi$_{0.5}$TiO$_3$—BaTiO$_3$ (NBTBT).

Object 15 is any method of Objects 13 or 14 further comprising printing an electrode on the piezoelectric ceramic. Electrodes can be of any appropriate material, such as metals chosen from silver, gold, palladium, or platinum, or their alloys. Even further, any of the compositions or composites of Objects 1-12 can comprise electrode material, preferably as an internal electrode in a multilayer composition or composite.

Object 16 provides methods of Objects 13-15, wherein the NBT seed crystallites have an aspect ratio of greater than 2. Such NBT seed crystallites can be and are preferably synthesized by topochemical conversion from BIT platelets. NBT crystals synthesized in this manner have greater aspect ratios than their conventional NBT crystal counterparts, which have a cubic shape. A high aspect ratio leads to formation of structures with improved properties.

The compositions or composites of Objects 1-12 may be made by any of the methods detailed in Objects 13-16. Further, these methods can be altered by omitting or re-arranging one or more of the method steps to achieve a particular desired result. Likewise, additional method steps can be added. Examples of such methods are provided in greater detail below and the method steps detailed further can also be mixed and matched for certain purposes.

Object 17 is a composition comprising Na$_{0.5}$B$_{0.5}$TiO$_3$—BaTiO$_3$ ferroelectric whiskers having an aspect ratio of greater than 1 and surface grains ranging in size from 100-500 nm. Such compositions can comprise an aspect ratio preferably of from 5-20.

Object 18 is a composition of Object 17, wherein the whiskers are of formula (Na$_{0.5}$Bi$_{0.5}$TiO$_3$)$_{(1-x)}$—(BaTiO$_3$)$_x$ and where x is 0.05, 0.6, 0.7, or 0.08.

The compositions of Objects 17 or 18 can be prepared by molten salt synthesis and topochemical transformation using Na$_2$Ti$_6$O$_{13}$ as a host structure.

Object 19 is a method of making NBTBT whiskers comprising: combining an NBTBT matrix with high aspect ratio Na$_2$Ti$_6$O$_{13}$ whiskers; heating the matrix and whiskers to between 800-900° C.; for a sufficient time to cause rearranging of the Na$_2$Ti$_6$O$_{13}$ into the ABO$_3$-type NBTBT whiskers and formation of surface grains on the NBTBT ranging in size from 10-1000 nm. Such compositions can comprise surface grains of about 100-500 nm.

Object 20 is a composition comprising a KBT-BT-NBT ceramic. Such compositions can comprise a KBT-BT-NBT ceramic with a KBT:BT ratio of 2:1. Such compositions can comprise alternatively or in addition a KBT-BT-NBT ceramic with a $T_d$ of greater than 100° C. Alternatively or in addition, such compositions can comprise a KBT-BT-NBT ceramic with a $d_{33}$ of greater than 100 pC/N. In embodiments, such compositions can be in the multilayered form with inner electrodes comprising of silver, gold, palladium, platinum or their alloys. Likewise, such compositions can be in the composite form with inner electrodes comprising of silver, gold, palladium, platinum or their alloys.

For a better understanding of the invention, its advantages, and the objects obtained by its use, reference should be made to the drawings that form a further part hereof, and to the accompanying descriptive matter, in that there is illustrated and described preferred embodiments of the invention. The features and advantages of the present invention will be apparent to those skilled in the art. While numerous changes may be made by those skilled in the art, such changes are within the spirit of the invention.

BRIEF DESCRIPTION OF THE DRAWINGS

The accompanying drawings illustrate certain aspects of some embodiments of the present invention, and should not be used to limit or define the invention. Together with the written description the drawings serve to explain certain principles of the invention.

FIGS. 2A-D are graphs illustrating (A) temperature dependence of relative permittivity and loss tangent of poled textured NBTBT specimen, (B) P-E hysteresis of various NBTBT textured ceramics with different degree of orientation, (C) remnant polarization (2 Pr) versus E-field for textured and randomly oriented specimen, and (D) coercive field ($2E_c$) versus E-field field for textured and randomly oriented specimens.

FIG. 4A is an image showing NBT templates synthesized using a topochemical conversion method.

FIG. 4B is an image showing the fractured surface of textured NBTBT ceramics.

FIGS. 4C-D are images of EBSD orientation map of a randomly oriented NBTBT specimen and $(100)_{pc}$ textured NBTBT, respectively.

FIG. 4E is a bright field TEM image of NBT seed and textured grain grown thereon.

FIG. 4F is an image of the magnified view of the interface of FIG. 4E.

FIG. 4G is an image showing lattice fringes near the interface of the seed and textured grain of FIGS. 4E and 4F.

FIG. 4H is an image of the nano domain in the textured grain of FIGS. 4E-G near the interface region.

FIG. 4I is an image showing an FFT pattern corresponding to the nano domain regions of FIG. 4H depicting splitting of spots.

FIG. 4J is an image showing the nano domain running across the interface without deviation for the textured specimen.

FIG. 4K is a dark field image depicting the contrast change due to polar nano regions of the textured specimen.

FIG. 4L is an HTEM image depicting the contrast change due to polar nano regions of the textured specimen.

FIG. 5A is a schematic diagram showing representative growth of textured NBTBT grain on an NBT template where the NBT seed is surrounded by NBTBT powder at an initial stage of the preparation process.

FIG. 5B is a schematic diagram showing the formation of the liquid phase in the vicinity of NBT seed and nucleation of a new phase during a representative sintering process.

FIG. 5C is a schematic diagram showing growth of $[001]_{pc}$ textured grain by way of epitaxial growth on an NBT template on prolonged sintering process at ~1175° C.

FIG. 5D is a schematic diagram showing the potential barrier of NBT seed platelets and metastable liquid phase, where the difference in the potential barrier indicates the activation energy for diffusion.

FIGS. 7A-D are SEM micrograph images of (A) NTO whisker matrix and NBTBT whiskers after reaction at (B) 700° C., (C) 800° C. and (D) 900° C.

FIGS. 8A-F are magnified SEM micrograph images depicting the morphological changes in the whiskers reacted at (A) 200° C., (B) 500° C., (C) 600° C., (D) 700° C., (E) 800° C. and (F) 900° C.

FIGS. 9A-B are schematic representations of (A) the transformation of the $Na_2Ti_6O_{13}$ structure into an $ABO_3$-type perovskite structure (NBTBT) through rearrangement of the octahedral connectivity type, and (B) the perovskite structure ($ABO_3$).

FIGS. 10A-D are images of the change in the morphology of the isolated whiskers heated on an alumina plate in air at various temperatures (A) 1000° C., (B) 1100° C., (C) 1175° C. and (D) 1200° C.

DETAILED DESCRIPTION OF VARIOUS EMBODIMENTS OF THE INVENTION

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

In accordance with embodiments of the present invention, provided are lead-free ceramic materials synthesized by a texturing process. More particularly, embodiments are comprised of a synthesized, textured lead-free piezoelectric $(Na_{0.5}Bi_{0.5}TiO_3)$—$BaTiO_3$ (NBTBT) that uses NBT platelets as seed.

Example I. NBTBT Piezoelectric Materials with NBT Seeds

Existing NBTBT ceramics provide randomly oriented ceramics, where the symmetry of the material differs from embodiments of the invention, which comprise ceramics utilizing a texturing process.

Figures 1A, 1B, 1C:
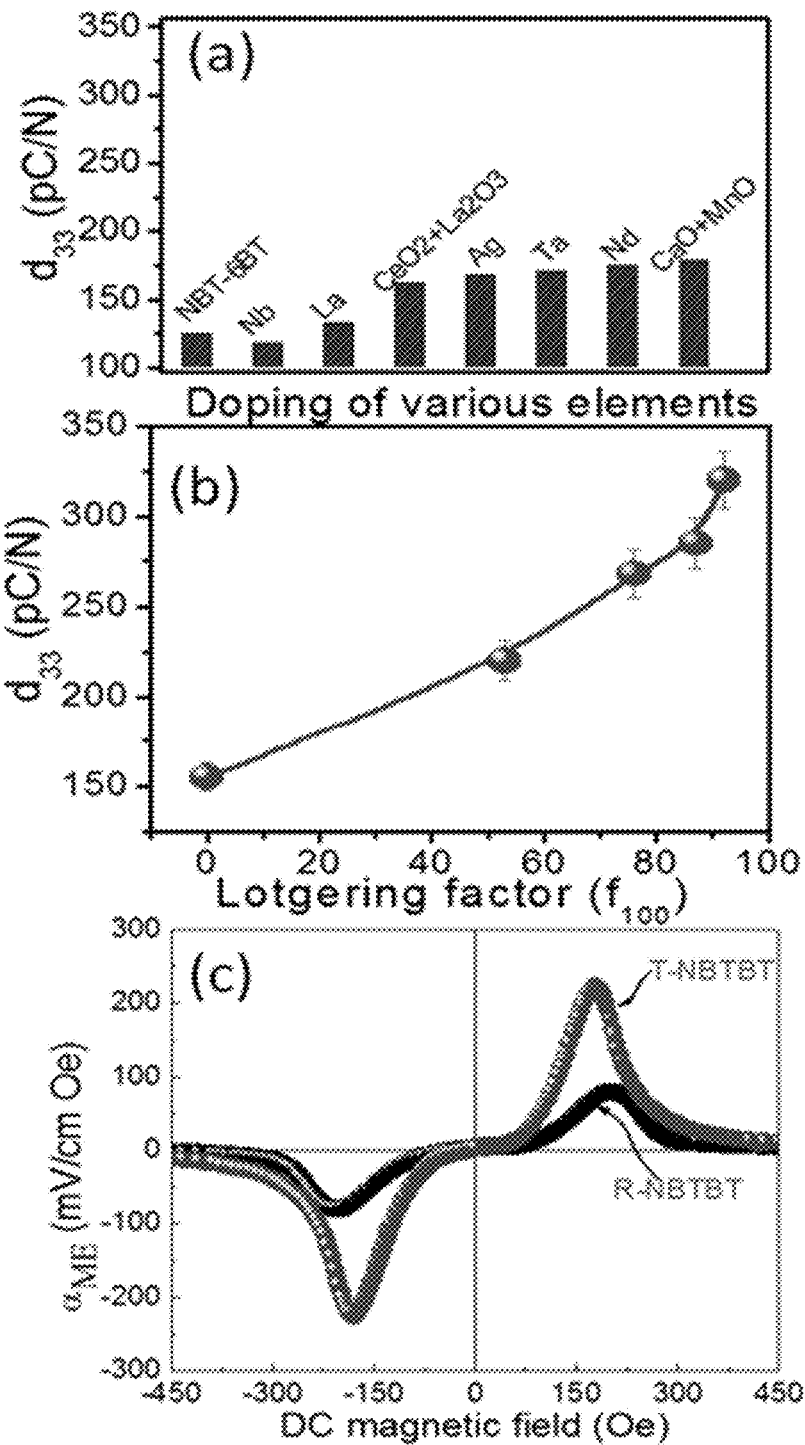
FIGS. 1A-C are graphs illustrating (A) $d_{33}$ versus Lotgering factor, (B) $d_{33}$ versus various dopants, and (C) ME voltage coefficients for trilayer laminates of Metglas/NBTBT/Metglas for randomly oriented and textured NBTBT systems.

Referring now to the figures, FIGS. 1A and 1B reveal the advantage of texturing over dopant engineering in achieving high piezoelectric response in lead-free NBTBT systems. FIG. 1C illustrates a textured NBTBT specimen showing improved characteristics over randomly oriented NBTBT. For example, randomly oriented ceramics were found to possess a longitudinal piezoelectric constant $d_{33}$ of 160 pC/N. In contrast, for a corresponding 92% textured NBTBT specimen, the $d_{33}$ value is about 322 pC/N.

In preferred embodiments, compositions of the invention can have a $d_{33}$ value of higher than 100 pC/N, such as from 150-500 pC/N. Preferred ranges for a $d_{33}$ value of compositions of the invention can be from 200-300, 250-350, 300-500, 350-450, and so on. Especially preferred compositions of the invention have a $d_{33}$ value of about 200-500 pC/N. Additionally or alternatively, in preferred embodiments the $d_{33}$ value of textured samples shows an increase of 100% or more of that of a randomly oriented NBTBT of the same composition. In the context of this specification, what is meant by the textured and randomly oriented specimens having the same or a similar composition is that the compositions are the same preferably within 1.0 at. % (or up to about 5 at. %) as confirmed by elemental analysis using Energy-dispersive x-ray spectroscopy (EDS). In embodiments, for example, the $d_{33}$ value of textured NBTBT compared to randomly oriented NBTBT with the same empirical formula is 1-5 X that of the random NBTBT counterpart.

The $d_{33}$ for textured NBTBT specimens was found to be almost comparable to that of the single crystal value of NBT-based systems of similar composition and hard PZT ceramics. For comparison, representative characteristics of these materials are provided below in Table I.

TABLE I

Piezoelectric and ferroelectric properties of PZT4 ceramics and NBT-BT, Mn: NBT-BT (Pt) [Grown using Pt seed], and textured NBTBT.

| Sample | $d_{33}$ (pC/N) | $k_{t\,(\%)}$ | $k_{31}$ (%) | $P_r$ ($\mu C/cm^2$) | $E_c$ (kv/mm) |
|---|---|---|---|---|---|
| PZT4 | 250 | 48 | 33 | — | 3.27 |
| NBT-BT[a] | 280 | 56 | — | 16.44 | 2.67 |
| Mn: NBT-BT(Pt)[b] | 287 | 55.6 | 39.7 | 35 | 2.91 |
| Textured NBTBT | 322 | 57.3 | — | 35 | 1.8 |

[a]W. Ge, H. Liu, X. Y. Zhao, B. J. Fang, X. B. Li, F. F. Wang, D. Zhou, P. Yu, X. M. Pan, D. Lin, and H. S. Luo, J. Phys. D: Appl. Phys., 2008, 41, 115403.
[b]Q. Zhang, Y. Zhang, F. Wang, Y. Wang, D. Lin, X. Zhao, H. Luo, W. Ge, and D. Viehland, Appl. Phys. Lett., 2009, 95, 102904.

See W. Ge, H. Liu, X. Y. Zhao, B. J. Fang, X. B. Li, F. F. Wang, D. Zhou, P. Yu, X. M. Pan, D. Lin, and H. S. Luo, *J. Phys. D: Appl. Phys.*, 2008, 41, 115403; and Q. Zhang, Y. Zhang, F. Wang, Y. Wang, D. Lin, X. Zhao, H. Luo, W. Ge, and D. Viehland, *Appl. Phys. Lett.*, 2009, 95, 102904. Preferred are textured specimens with a $d_{33}$ value that approaches that of a single crystal NBTBT.

Example II. Trilayer NBTBT Multilayer Composite

In order to demonstrate the superior performance of textured NBTBT ceramics, the magnetoelectric response of textured and randomly oriented NBTBT in Metglas/NBTBT/Metglas configuration was measured. At 1 kHz, a magnetoelectric (ME) coefficient of 222 mV/cm/Oe was obtained (FIG. 1C). Further demonstrated in FIG. 1C was a 300% enhancement in magnetoelectric response for composites fabricated using a textured NBTBT layer. More details about the sample preparation are provided below.

In embodiments the magnetoelectric response can show an enhancement of from about 10%-1000%. In preferred embodiments, the ME coefficient can show from 1-10 X an improvement over a random oriented counterpart of the same configuration, such as from 10-50% more, 50-100%, 100-150%, 150-200%, 200-250%, 250-300%, 300-350%, 350-400%, 400-450%, 450-500%, 500-550%, 550-600%, 600-650%, 650-700%, 700-750%, 750-800%, 800-850%, 850-900%, 900-950% and 950-1000% more.

Although the synthesis of textured NBT based systems has been pursed before, it has been met with very limited improvements. (Y. Saito, S. Kwon). In contrast, embodiments of the present invention provide textured NBT systems using NBT seeds as a template. In embodiments, fabricating NBT seeds achieves the desired shape, dimension, and interface stability. The template single crystals should have a high aspect ratio and a lattice mismatch of less than 5%. See G. L. Messing et al., S Trolier-McKinstry, E. M. Sabolosky, C. Duran, S. Kwan et al., Critical Review in Solid State and Materials Sciences, 2004, 29, 45. The aspect ratio (width to length) of the NBT seeds according to embodiments of the invention can range, for example, from 1-50, such as from 2-40, or from 3-30, or from 4-25, or from 5-20, or from 6-18, or from 7-15, or from 8-12, such as about 10.

In the texturing processes, epitaxial growth occurs on the template seeds which are aligned in the casting direction in the matrix powder. One of ordinary skill in the art may surmise that the best suitable template for texturing NBT based ceramics would be NBT seeds. Existing NBT seeds, however, have a macroscopic cubic symmetry at high temperature which configuration leads to the symmetrical size of NBT based crystallites. These symmetrical crystallites cannot be aligned using the tape casting method and instead crystallites with a higher aspect ratio are needed, i.e., non-symmetrical or non-cubic. Therefore, according to embodiments of the invention NBT templates are synthesized with shape anisotropy through topochemical conversion from BIT platelets using molten salt synthesis method. See Deepam Maurya, Valeri Petkov, Ashok Kumar and Shashank Priya, Dalton Trans., 2012, 41, 5643. The NBT crystallites formed using synthesis methods of the invention provide crystallites with a width greater than their length, or an aspect ratio of greater than 1. Accordingly, the NBT platelets can be aligned in the base matrix powder by shear force during tape casting.

FIG. 2A depicts the temperature dependence of relative permittivity and loss tangent for a poled textured specimen. The depoling temperature ($T_d$) and temperature of maximum relative permittivity ($T_m$) were found to be ~90-100° C. and ~300° C., respectively, while $T_d$ and $T_m$ were found to be 125 and 350° C. for the randomly oriented counterpart. In embodiments $T_d$ can range from 50-300° C., including but not limited to, 50-100° C., 100-150° C., 150-200° C., 200-250° C., and 250-300° C. Additionally, $T_m$ can range from 200-500° C., including but not limited to, 200-250° C., 250-300° C., 300-350° C., 350-400° C., 400-450° C., and 450-500° C. Alternatively or additionally, $T_d$ and/or $T_m$ of textured compositions of the invention can be less than that of a random counterpart with the same chemical composition, such as about 10%, or 20%, or 25%, or 30-50%, or 75% less. The textured specimen was found to depict characteristic diffuse nature of phase transition as observed for their randomly oriented counterparts.

FIG. 2B presents PE hysteresis loops at 1 kHz for NBTBT ceramics with different values of orientation. The randomly oriented specimen exhibits square loop with high coercive filed. Interestingly, all textured specimens were found to depict the pinched loop. The specimen with 92% texturing was found to show $2P_r \sim 65$ pC/N.

FIGS. 2C and 2D show the Remnant polarization and coercive filed as a function of E-field. The randomly oriented specimen shows an almost monotonous increase in the remnant polarization with increase in E-field. However, in the case of the textured specimen, the remnant polarization increases sharply after a certain field and became constant. The origin of pinched PE loop in NBTBT systems may sometimes be attributed to AFE nature and presence of polar nano regions. The coercive field of the textured specimen was also found to be lower than that of randomly oriented specimens of the same composition. The low coercivity and sudden increase in the remnant polarization in textured specimen shows the coherent nature of domain switching and higher mobility than that of randomly oriented ceramics. Recently, in-situ bulk neutron diffraction patterns revealed that the pseudo-cubic nature of the bulk lattice was maintained in the textured specimen subsequent to the application of E-field. See Deepam Maurya, Abhijit Pramanick, Ke An, and Shashank Priya, Appl. Phys. Lett., 2012, 100, 172906. In contrast, significant distortions in diffraction peak profiles were observed in the randomly oriented specimen, indicating coexistence of phases with rhombohedral and tetragonal symmetries. The absence of E-field induced structural phase transformation in the textured NBTBT was attributed to smaller coherence length scales of PNRs and inhibition due to internal stress generated by domain switching which precedes a structural transformation.

Figure 3A:
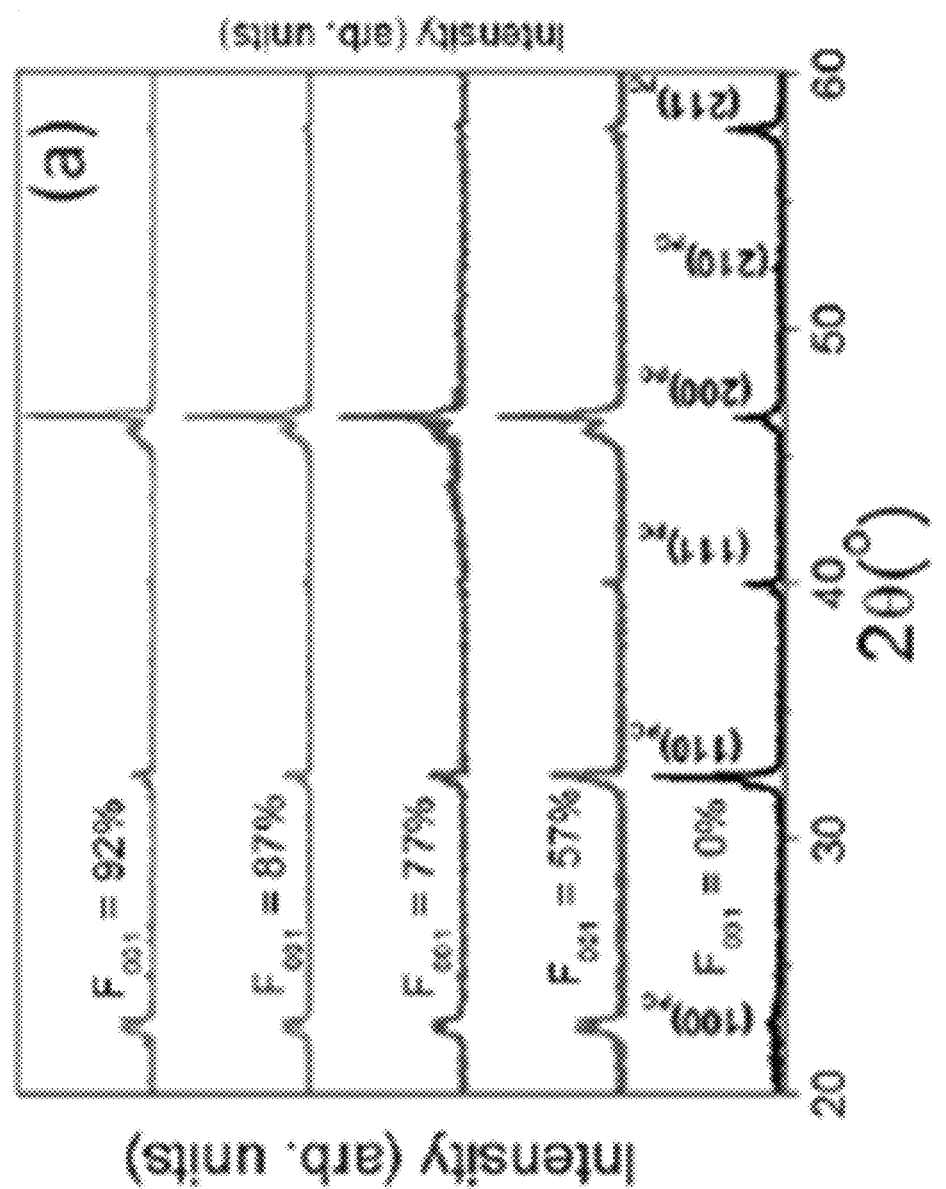
FIGS. 3A-B are graphs of (A) XRD data recorded at room temperature for various specimens of NBTBT (note the increasing relative intensity of $\{001\}_{PC}$ Bragg reflections for textured specimens); and (B) 1-D XRD (~115 keV, wavelength=0.10798 Å) patterns of T-NBTBT (textured NBTBT) and R-NBTBT (random NBTBT).

FIG. 3A shows the XRD-spectra recorded at room temperature for NBTBT specimens with different degrees of texturing. The relative increase in the intensity of $\{100\}_{pc}$ Bragg reflections clearly indicates increase in the degree of texturing which was quantified using the Lotgering factor ($f_{100}$). See F. K. Lotgering, J. Inorg. Nucl. Chem., 1959, 9, 113. Temperature and time of processing were optimized to further achieve a high degree of texturing. The longitudinal piezoelectric constant $d_{33}$ was found to increase with the increase in the degree of texturing in $[001]_{pc}$ orientation. In order to confirm the phase and structural differences, synchrotron XRD patterns were recorded on textured and randomly oriented counterparts of NBTBT.

Figure 3B:
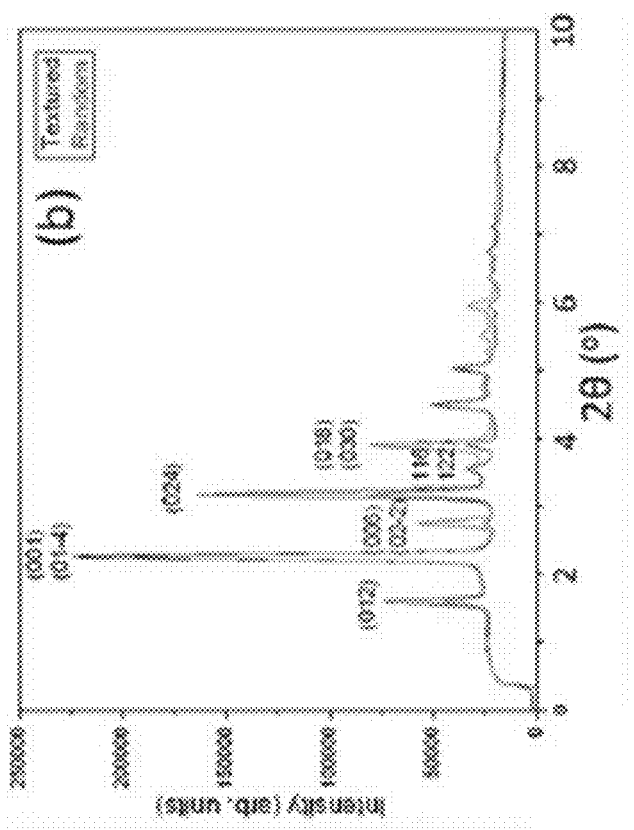
Figure 3C:
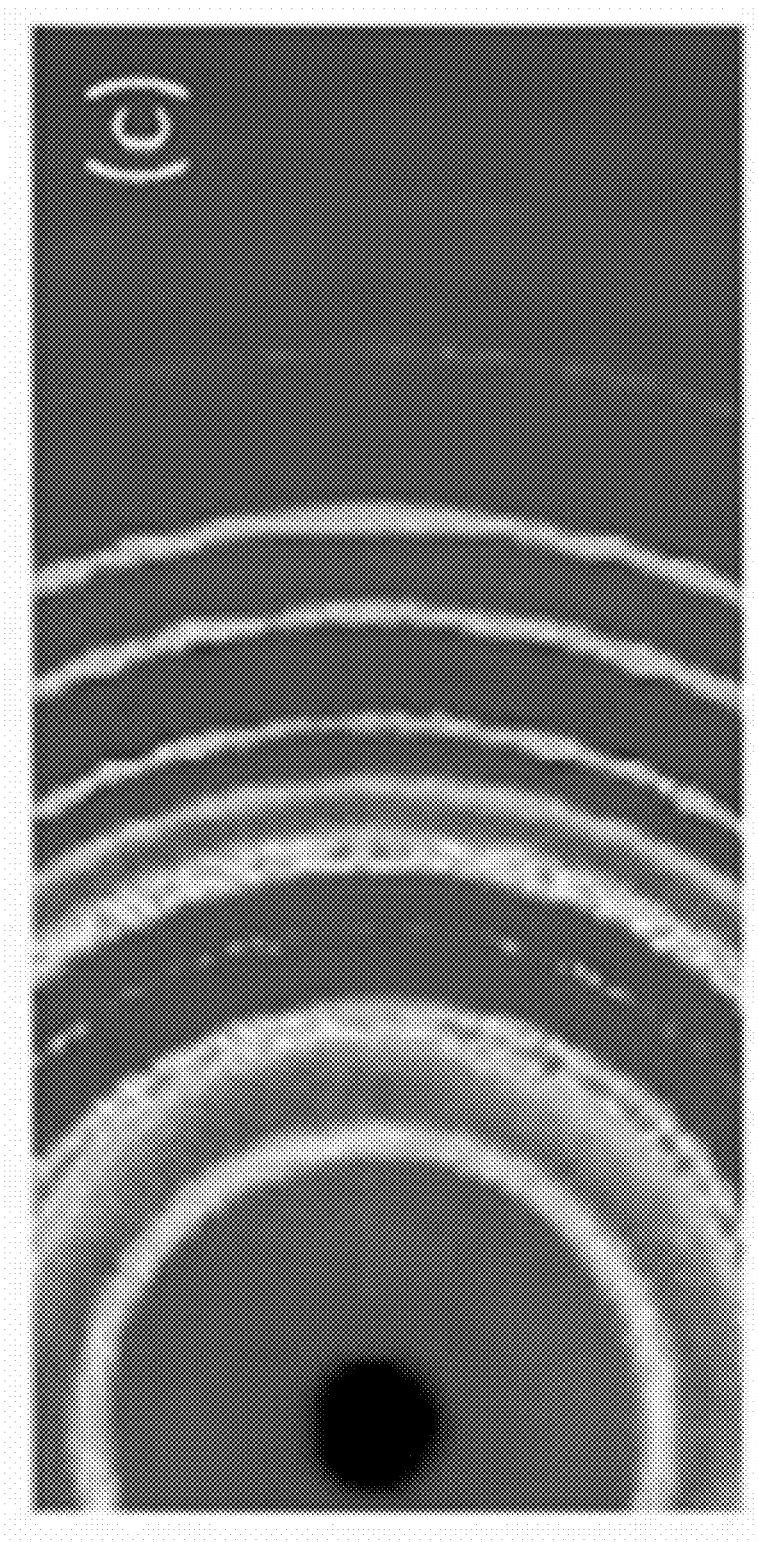
FIGS. 3C-D are 2-D XRD images corresponding to the one-dimensional (1-D) XRD data shown in FIG. 3B for T-NBTBT (textured) and R-NBTBT (random) samples.
Figure 3D:
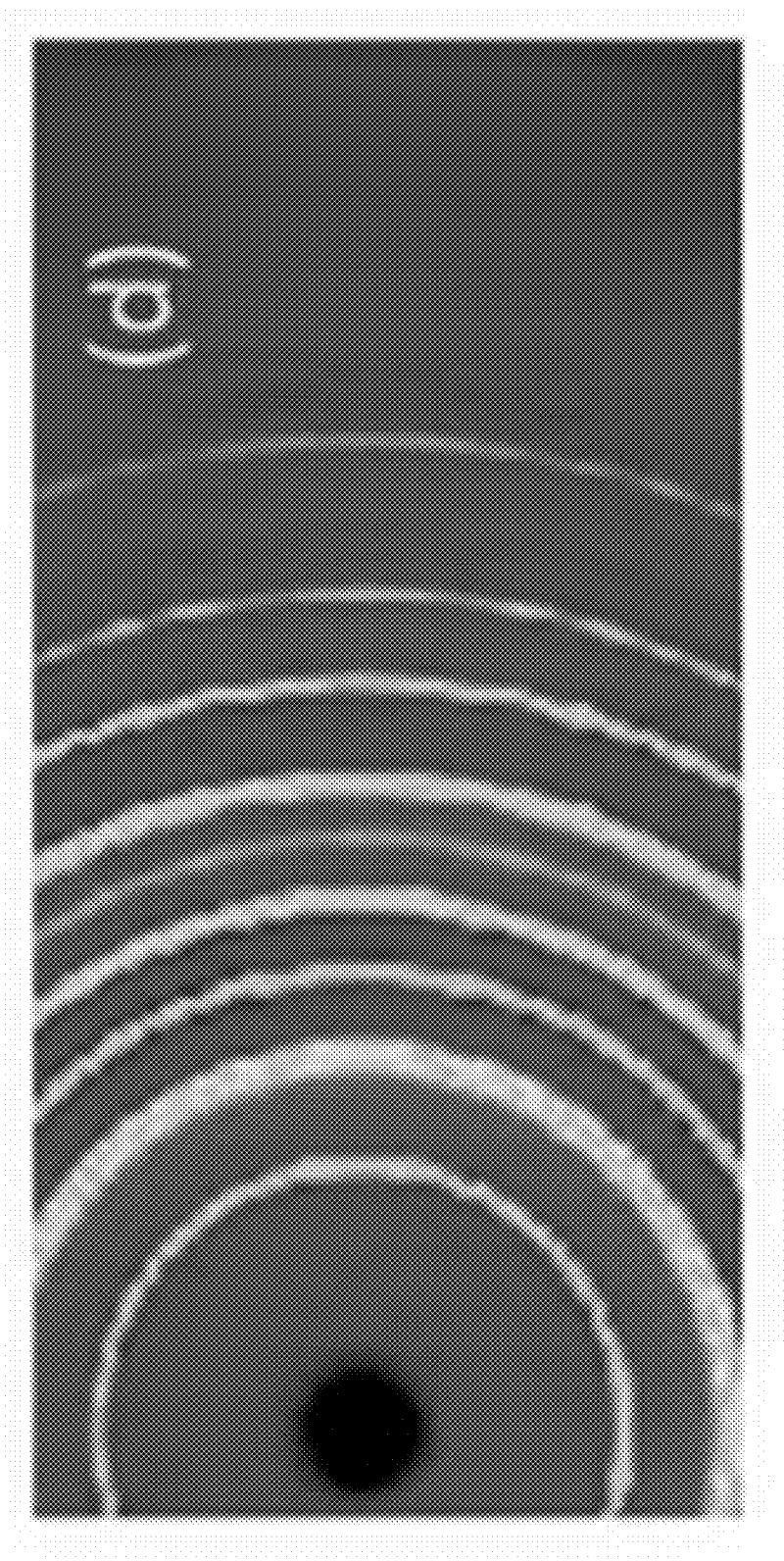

FIG. 3B shows the one-dimensional (1-D) XRD-patterns for textured and randomly oriented specimens and corresponding two-dimensional (2-D) images are shown in FIGS. 3C-D. The XRD results confirmed that both systems were crystallized in a similar phase. The difference in the intensity of Bragg peaks in 1-D data and Debye-Scherrer rings in 2-D data of both the variants reflects the textured nature of NBTBT piezoceramics.

FIG. 4A depicts the morphology of NBT platelets synthesized using a topochemical conversion method. The NBT templates were aligned in the base matrix during heat treatment at higher temperature and epitaxial growth occurred at the $(001)_{pc}$ oriented surface of the template. FIG. 4B depicts the fracture surface of the textured specimen showing growth of NBTBT textured grain on NBT template. In order to provide the spread of orientation, EBSD map of the top surface of randomly oriented and textured NBTBT specimens are shown respectively in FIGS. 4C and 4D. One can clearly notice that $[001]_{pc}$ textured grain dominated the microstructure in 3D, thus confirming the high degree of orientation. The color scheme was based on the inverse pole figure depicted in the inset of FIG. 3D. The growth of textured grains is the result of epitaxial growth on NBT seed aligned in the NBTBT matrix.

A schematic representing the mechanism of the growth of textured grain on NBT seed is shown in FIGS. 5A-D. In preferred embodiments, liquid phase sintering has been found to play an important role in nucleation and growth during sintering process of NBT based piezoelectric materials. (Deepam 2011). In NBTBT, the liquid phase is predominantly facilitated by Na and Bi. The driving force for the growth is the chemical potential difference of the stable NBT seed and metastable liquid phase. During growth of the textured grain, the increase in size of the epilayer could deform the crystallization interface requiring surface tension and surface stress to be included in the thermodynamics of the growth process. However the present invention utilizes NBT seeds and the epitaxial growth occurs with minimal stress at the interface and the crystallization interface is not expected to deform. Assuming a simple exchange process in which the atoms of the metastable liquid phase A and atoms of the solid crystalline phase B (NBT seed or epilayer) pass from one phase to other. This difference in chemical potentials of phase A and phase B drives the epitaxial growth as $$\Delta\mu = RT\ln\left(\frac{a_A^e a_B}{a_A a_B^e}\right),$$

where $a_A^{\in}$ is the activity of phase A at the equilibrium. See M. A. Herman, W. Richter, H. Sitter, Epitaxy: Physical Principles and Technical Implementation, Springer-Verlag Berlin Heidelberg, 2004. Generally, the growth rate is considerably slower than theoretically expected and therefore it is difficult to establish equilibrium throughout the system. Thus, to achieve a higher degree of texturing the system required prolonged exposure of heat treatment up to 50 h. The growth rate is limited by mass transport occurring due to combination of convection, diffusion and surface reaction rate. The growth process of textured grain can be assumed to occur through incorporation of atoms of liquid phase into crystalline order by overcoming the energy barrier $U_d$ (FIG. 5D). The crystallization rate per unit time at temperature T could be represented by $$\nu\exp\left(-\frac{U_d}{k_B T}\right),$$

where $\nu$ is the frequency of vibration of atoms around its average position and $k_B$ is the Boltzman constant. The texturing process occurred at higher temperature ~1175° C., the formation of liquid phase from the NBT seed cannot be ruled out. However, the Gibbs free energy in solid state is higher than that of liquid phase formed from the NBT seed by factor $$\left(-\frac{\Delta \mu}{k_B T}\right).$$

This phenomenon leads to a higher crystallization rate and the growth rate can be given by $$V_g = a_t \exp\left(-\frac{U_d}{k_B T}\right)\left(1 - \exp\left(-\frac{\Delta \mu}{k_B T}\right)\right),$$

where $\alpha_t$ is the thickness of the monatomic layer by which the crystallization interface moves. See F. K. Lotgering, J. Inorg. Nucl. Chem., 1959, 9, 113. Moreover, the gas-solid phase transition was expected to have a small contribution towards the growth process of the textured grain. The high green density of the specimen to be textured is very important step for getting high degree of texturing, because NBT seed should be in close proximity with the liquid phase in order to achieve nucleation and growth of new textured phase. The lower green density could allow vacuum between the NBT seed and the liquid phase resulting poor degree of texturing.

Next, to understand the mechanism of texture and the epitaxial growth of textured grain, HR-TEM microstructural analysis was performed. FIG. 4E depicts the bright field TEM image of the seed and surrounding textured grain. The magnified view of the interface is depicted in FIG. 4F. The close observation at the interface indicated coherent interface between seed and textured grain. The coherent interface without defect could be attributed to the smaller lattice mismatch between NBT template and the textured NBTBT grain, which is important factor to get superior functional response in the given system. FIG. 4G depicts the lattice fringes across the coherent interface of NBT seed and textured grain. The FFT patterns obtained from the textured grain clearly show its $(001)_{pc}$ orientation. FIG. 4H depicts presence of nanodomain in textured grains, however on changing the focus we could observe these domains were actually running across the coherent interface FIG. 4J. The FFT pattern obtained from the area related to domain structure in FIG. 4H was found to depict the splitting of the spots due to presence of nano twins (FIG. 4I). Besides these needle shaped nano domains, the polar nano regions were found to be distributed in the matrix. The dark field image corresponding to same region clearly depicts these PNRs in FIG. 4K. Additionally, FIG. 4L provides an HTEM image depicting the contrast change due to polar nano regions. FIG. 4I presents lattice fringes near the interface and the contrast change is related to polar nano regions (PNRs) distributed in the matrix. The presence of nano domains with higher mobility leads to high piezoelectric response. The statistical distribution of these PNRs with different Curie point modulates the Curie point to Curie range resulting in diffused nature of phase transition. The high piezoelectric response and low coercive field in textured NBTBT could be attributed to the domain engineered state and smaller size of these nano domains with higher mobility.

In summary, $[001]_{pc}$ textured lead-free piezoelectric ($Na_{0.5}Bi_{0.5}TiO_3$)—$BaTiO_3$ (NBTBT) was successfully synthesized using NBT platelets as seed. The 92% textured specimen was found to depict 200% and 300% improvement in longitudinal piezoelectric constant ($d_{33}$) and magneto-electric coupling coefficient, respectively. The piezoelectric response was found to increase consistently with the increase in the degree of texturing. With respect to the mechanism of textured grain growth on the NBT seed, it can be seen that the interface of the NBT seed and the textured grain was found to be coherent and defect free facilitating domain wall motion. The textured specimens were also found to depict lower coercive field and coherent nature of domain switching. Thus, this demonstrates the importance of texturing in lead-free piezoelectric materials for achieving high piezoelectric response comparable to their single crystal counterparts.

Additional embodiments of the invention provide for methods of making the textured NBTBT ceramic materials and the NBT seeds from which the textured NBTBT is formed. One such method within the scope of the invention, and variations thereof, comprises performing all or some of the following steps and optionally additional steps within the skill of the art. Generally, textured specimens were prepared using a templated grain growth method. For this, the NBT templates were prepared using a topochemical conversion method. W. Zhao, H. Zhou, Y. Yan, and D. Liu, *J. Am. Ceram. Soc.*, 2008, 91, 1322. A topochemical conversion method is suitable for synthesizing anisotropic shaped materials which otherwise have isotropic structure. Next, the base matrix powder, for example, $0.93N_{0.5}Bi_{0.5}TiO_3$-$0.07BaTiO_3$, is synthesized using methods reported in the literature.

In preferred embodiments, the base matrix powder comprises 93% NBT and 7% BT. Composition embodiments of the invention can also comprise from between 0-100% of NBT or BT by weight. Such embodiments may comprise, for example, 90% NBT and 10% BT, 80% NBT and 20%, 70% NBT and 30% BT, 60% NBT and 40% BT, or 50% NBT and BT, or 40% NBT and 60% BT, 30% NBT and 70% BT, 20% NBT and 80% BT, and 10% NBT and 90% BT based on weight of the composition. The amounts can also be expressed as ratios ranging from between 0:100 and 100:0 NBT:BT.

The powders were mixed with the binder system and ball milled for 24 h. The resulting slurry was subsequently mixed with 10 vol percentage of NBT template and stirred for 6 h followed by tape casting with the doctor blade height 250 um. In embodiments, any amount of NBT template can be used, for example, from about 1-50% template seeds, with preferable ranges being around 5-20% template seeds, by volume. Other methods of aligning or orienting the NBT particles within the matrix can be used, including any extrusion type system. Such devices may comprise an opening through which the green body is extruded, where the opening is of a certain shape and size to cause a desired orientation of the NBT particles within the green mixture during extrusion. After drying, the tape was cut and laminated to the desired dimension followed by a binder burnout process with 0.3° C./min heating and cooling rate. Any number of layers of the green body can be used to obtain the desired shape and size material. In preferred embodiments, the material at this stage is layered from 1-50 times and more preferably from about 5-20 times. More particularly, the green body can be folded on itself or cut to a desired length, then stacked on other portions of the green body material. Once the desired form is achieved through layering of the material, the layers of the form or structure are laminated. In this example, the specimens were subjected to cold isostatic pressing (CIP) to improve green density followed by sintering at 1175° C. for 5-50 h with heating and cooling at a rate of approximately 10° C./min. A schematic of a general TGG process and resultant green body configuration is given in FIG. 5A.

The surface morphology of the sintered samples was observed using a LEO Zeiss 1550 (Zeiss, Munich, Germany)

scanning electron microscope. Room temperature XRD-spectra were recorded by using a Philips Xpert Pro x-ray diffractometer (Almelo, The Netherlands). The degree of orientation was determined from the XRD pattern in the range of 2θ=20-60° by Lotgering's method. For electrical measurement, silver electrode was applied on the flat faces of the rectangular specimen and then fired at 650° C. for 30 minutes. In embodiments, electrodes may also be comprised of any metal, including but not limited to gold, bronze, aluminum, copper, lead, brass, palladium, or platinum, or their alloys. Samples were poled at 5 kV/mm at 60° C. in a silicon oil bath. The longitudinal piezoelectric constant ($d_{33}$) was measured by the Berlincourt method. The dielectric constant and tangent loss factor were determined as a function of temperature at select frequencies using an HP 4284A LCR meter connected to a computer-controlled high temperature furnace. Polarization-electric field (P-E) hysteresis and current versus voltage (I-V) measurements were conducted by using modified Sawyer-Tower bridge Precision II (Radiant Technologies).

To better reflect the performance of textured lead free piezoelectric samples, ME laminate composites were fabricated in the form of multilayer actuators comprising a trilayer structure corresponding to Metglas/NBTBT/Metglas. Magnetostrictive/piezoelectric/magnetostrictive composites according to the invention can comprise any magnetostrictive layer, such as Metglas, Terfenol-D, or ferrite such as NZCF. Both NBTBT textured and random samples with dimensions of 4×7×0.3 $mm^3$ were poled at 3 kV/cm. After aging for 24 h, 0.15 mm thick Metglas sheets (4 layers, 2605sA1, Metglas Inc., USA) with the same dimension were laminated on both sides of the NBTBT plate by using epoxy resin (West System, USA) to form the trilayer laminates. Other methods of laminating the magnetostrictive and piezoelectric layers can be used, such as subjecting the layered sample to a desired pressure and temperature for a sufficient period of time to achieve a desired level of lamination. In embodiments, the sample can be subjected to a pressure of about 50-300 MPa, for a temperature ranging from about 25° C. to about 200° C. for up to about 2 hours. The ME effect was measured in L-T mode (longitudinally magnetized and transversely poled) configuration with the sample located in the center of the Helmholtz coil ($H_{ac}$=10e at 1 kHz) which itself was located in the center of large electromagnet ($H_{dc}$). The induced voltage was monitored using a lock-in amplifier. The EBSD orientation mapping was performed using the FEI Helios 600 Nanolab equipped with the Hikari camera for EBSD.

Example III. Ferroelectric NBTBT Whiskers

Additional embodiments of the invention provide for ferroelectric nanostructures that can be used to improve the piezoelectric properties. Ferroelectric nanostructures with high aspect ratios are highly desired but their synthesis is extremely challenging since, at reduced dimensions, most perovskites adopt a structure with cubic symmetry resulting in a highly isotropic shape during high temperature processing. There have been several approaches to obtain nanostructured materials with anisotropic shapes, such as the template-directed method, vapor phase synthesis, vapor-liquid-solid (VLS) growth, the solution-liquid-solid (SLS) technique, solvothermal synthesis, solution phase growth-based on capping reagents, self-assembly and lithography. These techniques typically involve multiple processing steps and a controlled environment, which limit their large scale application. Therefore, a new powder processing-based technique capable of providing ferroelectric perovskite structures of a high aspect ratio morphology is highly desired.

Additionally, there is a need to provide ferroelectric components at the nano to micro scale that do not contain lead. The present invention addresses both these issues and demonstrates the molten salt synthesis of lead-free $Na_{0.5}Bi_{0.5}TiO_3$—$BaTiO_3$ (NBTBT) ferroelectric whiskers through a topochemical transformation using $Na_2Ti_6O_{13}$ as a host structure. This technique is highly cost-effective and can provide large quantities of lead-free NBTBT whiskers with a controlled morphology at a relatively low synthesis temperature. The topochemical reaction involves the introduction of guest species (ions) into a host structure resulting in a product with a different structure, but with a morphology similar to that of guest structure.

$Na_{0.5}Bi_{0.5}TiO_3$ is a well-known lead-free ferroelectric material. Solid solution of $(Na_{0.5}Bi_{0.5}TiO_3)_{(1-x)}$—$(BaTiO_3)_x$ (NBTBT) exhibits a morphotropic phase boundary (MPB) for x=0.05-0.08 providing enhanced piezoelectric properties. In embodiments, a composition near the MPB of the $(Na_{0.5}Bi_{0.5}TiO_3)_{(1-x)}$—$(BaTiO_3)_x$ system was selected (x=0.07) for the synthesis of NBTBT whiskers in this example. Indeed, any NBTBT composition can be used and particularly desired are those indicated earlier in this specification with respect to other embodiments of the invention. In the MPB region, both tetragonal and rhombohedral phases co-exist as the space group symmetry of these two ferroelectric phases is not connected by a direct group theoretical correlation. The piezoelectric/ferroelectric materials at MPB are characterized by an enhanced piezoelectric response. The enhancement in the piezoelectric properties at the MPB has been attributed to increased spontaneous polarization and near degeneracy of the tetragonal and rhombohedral states, which facilitates domain orientation under an applied electric field. The structural and morphological characterizations of NBTBT whiskers were performed using high-energy X-ray diffraction (XRD) and scanning electron microscopy to elucidate the phase, grain size and grain boundary morphology. Furthermore, HRTEM analysis was used to understand the change in the local microstructure and the mechanism of the topochemical transformation to lead-free NBTBT whiskers. The high temperature behavior and morphological changes of these lead-free NBTBT whiskers were investigated to elucidate the role of the surface energy.

$Na_2Ti_6O_{13}$ (NTO) whiskers were synthesized by the molten salt synthesis method. The molten salt synthesis method is suitable for realizing crystallites of complex oxides with shape anisotropy at low temperatures and with smaller reaction times due to the enhanced diffusion of reactants in molten salts. In this method, the starting materials are mixed together with a suitable salt (NaCl in the present case) and heated at a temperature higher than the melting point of the salt. After completion of the reaction, the product is washed several times with hot deionized water to remove the salt.

In this example, stoichiometric amounts of $Na_2CO_3$ and $TiO_2$ (rutile) powders were ball-milled for 24 h in a polyethylene bottle with yttria-stabilized $ZrO_2$ balls as the milling media and high purity ethanol as the solvent. The resulting slurry was dried in an oven at 80° C. for 6 h. This dried mixture was mixed with controlled amounts of NaCl followed by ball milling for 24 h to achieve homogeneous mixing. After drying, the homogeneous mixture was crystallized at 1100° C. for 2 h in a covered platinum crucible with a heating and cooling rate of 5° C. min-1. The resulting product was washed several times with hot deionized water to achieve NTO whiskers without a trace of salt. Various combinations of oxide to salt ratios can be used, including for example from 1:1, 1:2, 1:3, 1:4, 1:5, and so on. Ratios of 1:2, however, were found to provide a high aspect ratio of the host NTO whiskers. The concentration of the host matrix powder and whiskers for the MPB composition of lead-free $(Na_{0.5}B_{0.5}TiO_3)_{(1-x)}$—$(BaTiO_3)x$ with $x=0.07$ (denoted as NBTBT) was calculated using the chemical reaction as follows:

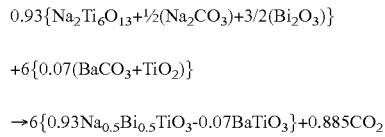

Stoichiometric amounts of oxide powders were mixed in 1:2 weight ratios with the salt and stirred for 6 h at room temperature (RT) in ethanol to ensure proper mixing. This mixture was dried in an oven for 24 h, followed by heating (heating rate: $5°$ C. $min^{-1}$) in a covered platinum crucible at 200, 500, 600, 700, 800 and $900°$ C. for 2 h followed by cooling (cooling rate: $5°$ C. $min^{-1}$) to RT. All the high temperature experiments were done in a Nabertherm muffle furnace. The resulting whiskers were washed with deionized water several times and dried at $80°$ C. for 24 h in an oven. XRD experiments (Cu K$\alpha$ radiation) were conducted on these whiskers to confirm the formation of the perovskite phase at RT using a PANalytical X'Pert Pro powder X-ray diffractometer at an operating voltage of 45 kV and a current of 40 mA. The morphological investigations were performed using a Zeiss LEO 1550 scanning electron microscope at a 5 kV accelerating voltage.

Figure 6A:
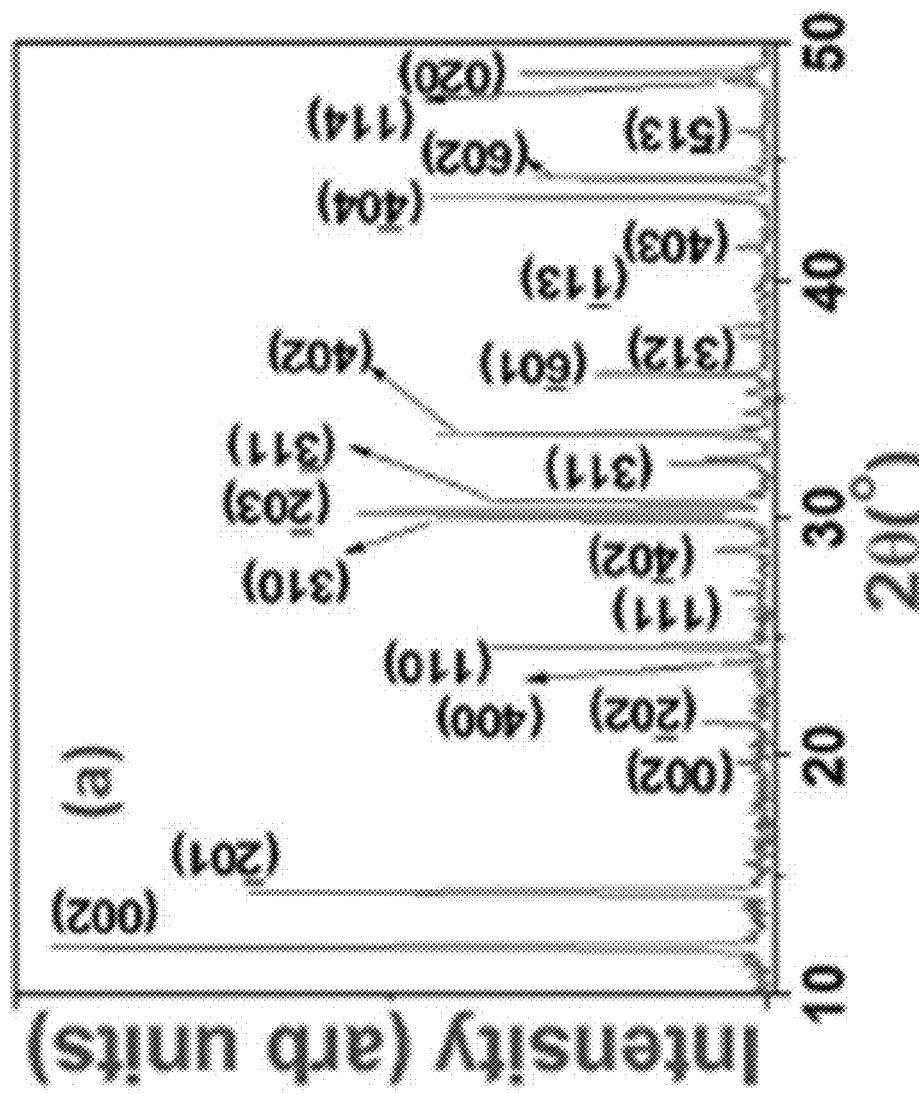
FIGS. 6A-F are graphs of Cu Kα X-ray diffraction data at RT for (A) NTO powder whiskers with monoclinic symmetry, (B) NBTBT processed at 800° C. and indexed with reference to the cubic phase, (C) NBTBT processed at 900° C. with an inset depicting the magnified view of the {111}c and {200}c reflections, where c stands for the cubic phase. The high energy X-ray diffraction data of NBTBT/900° C. (D) and the respective atomic PDF (E).
Figure 6B:
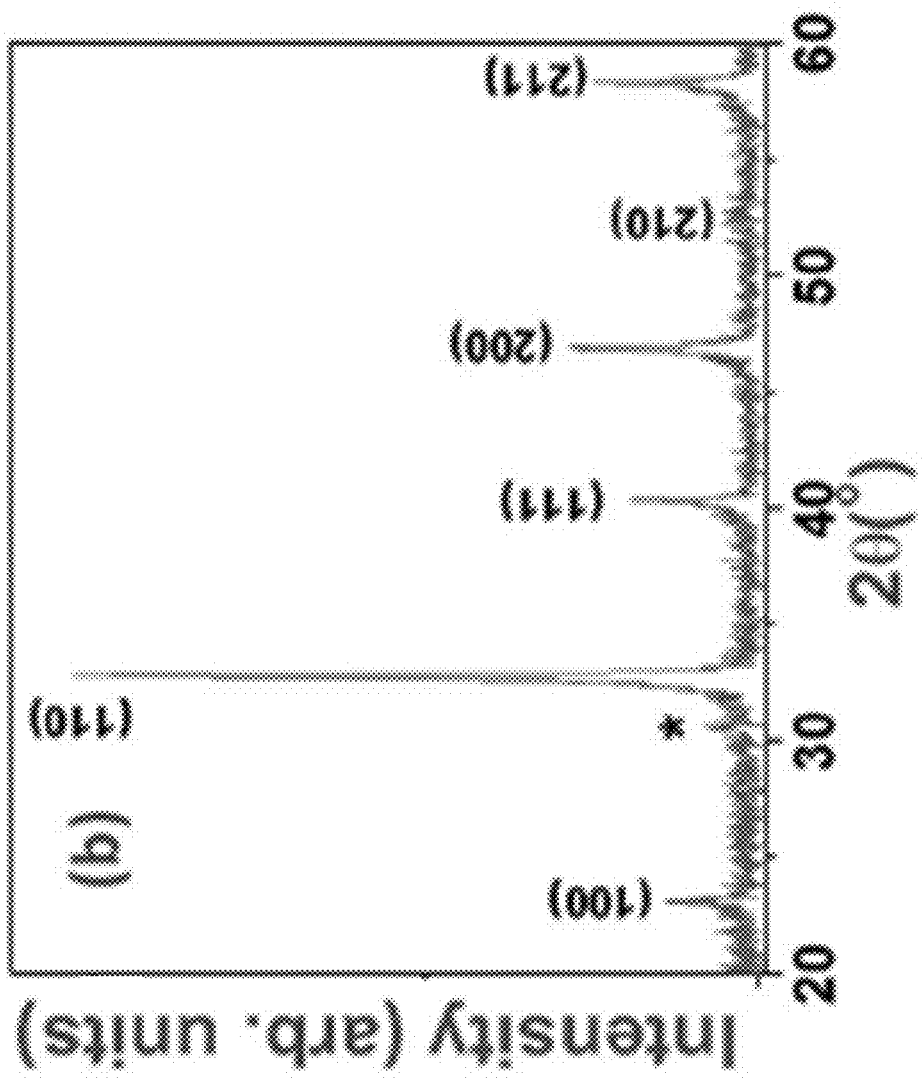
Figure 6C:
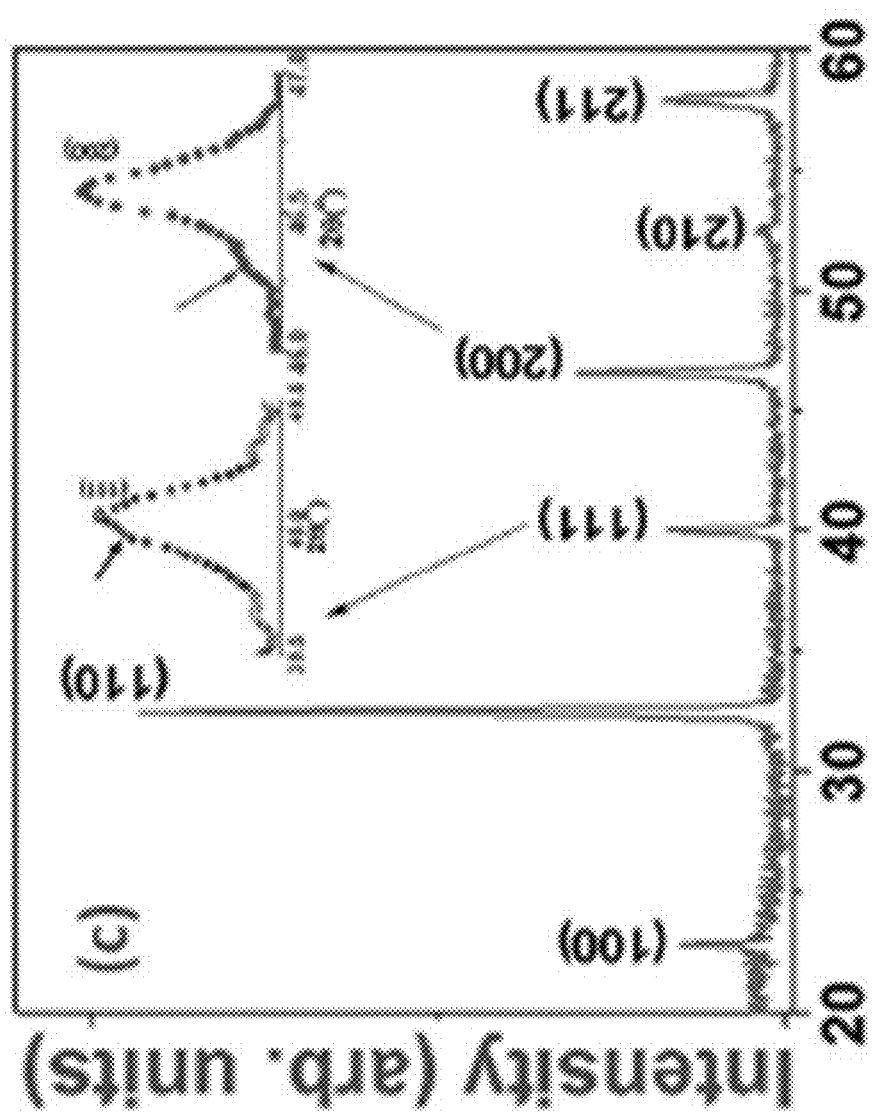
Figure 6D:
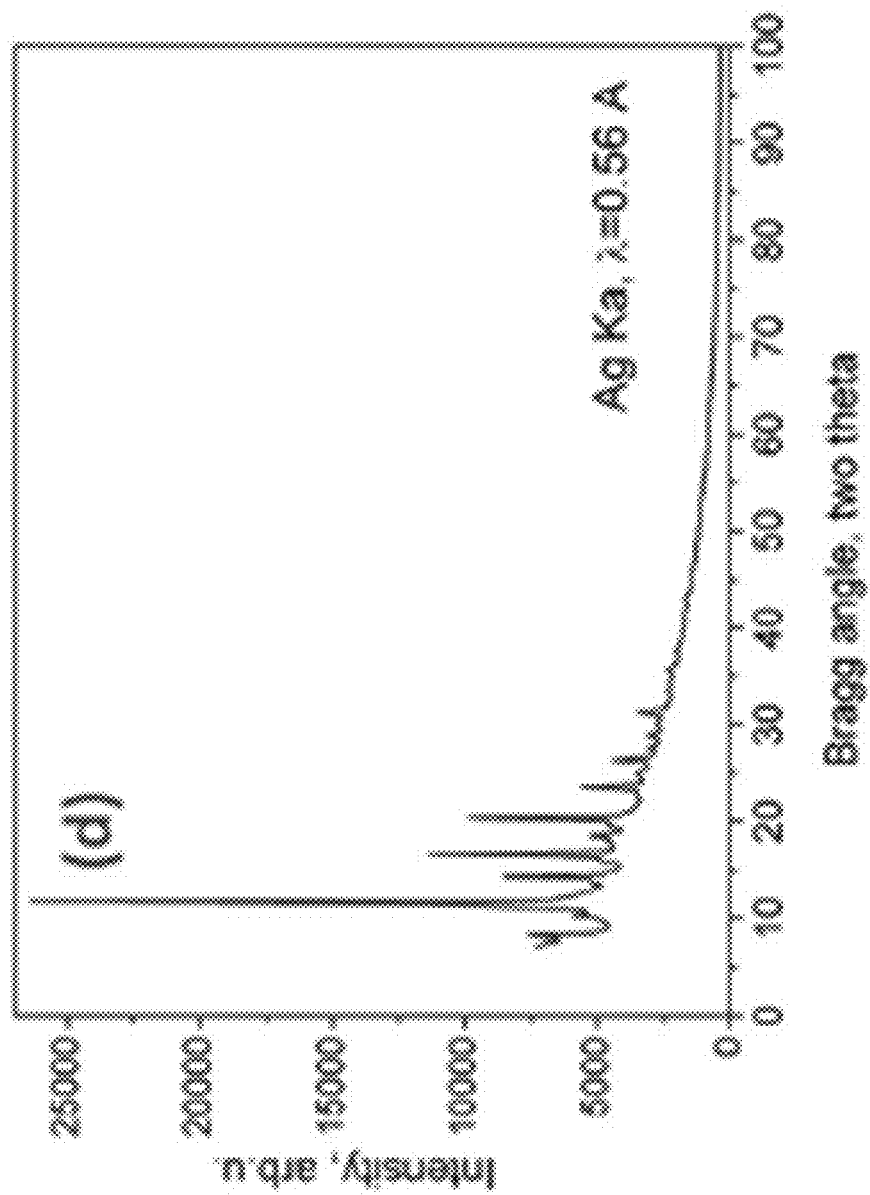
Figure 6E:
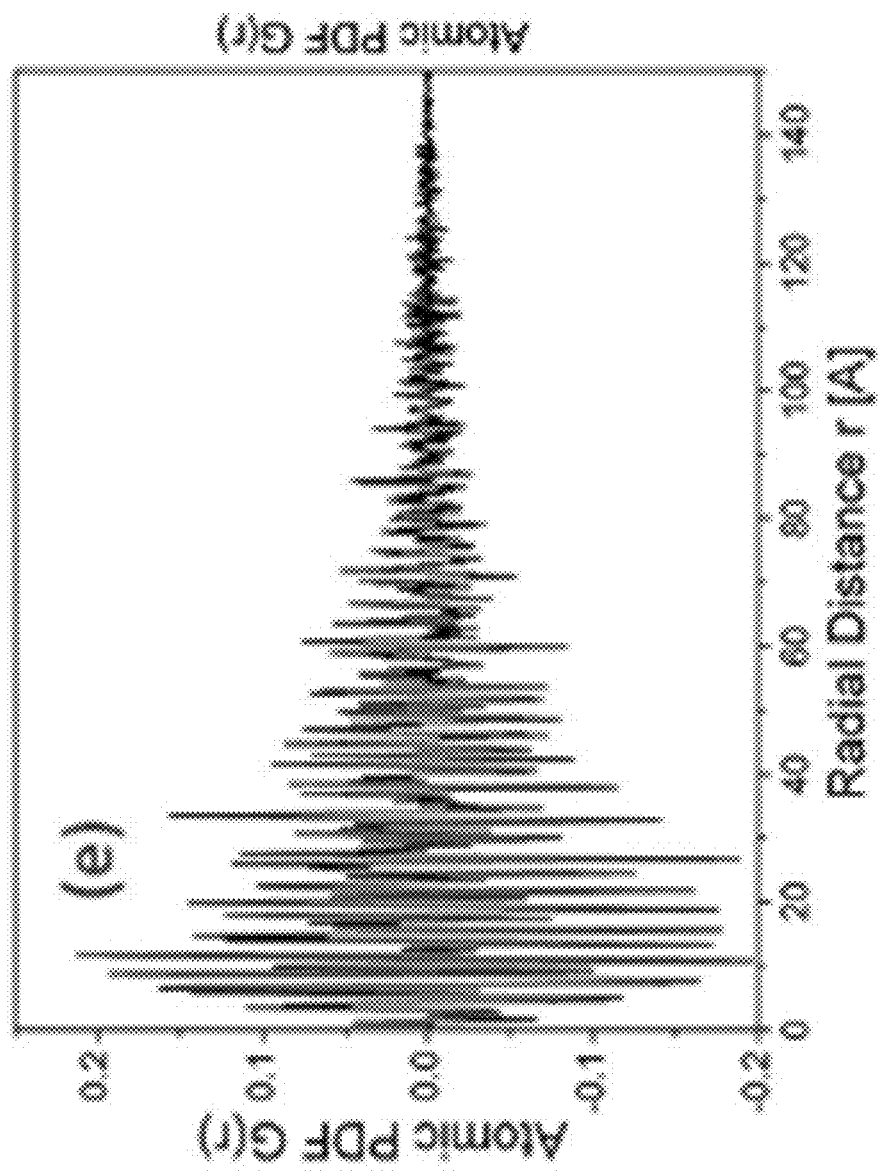
Figure 6F:
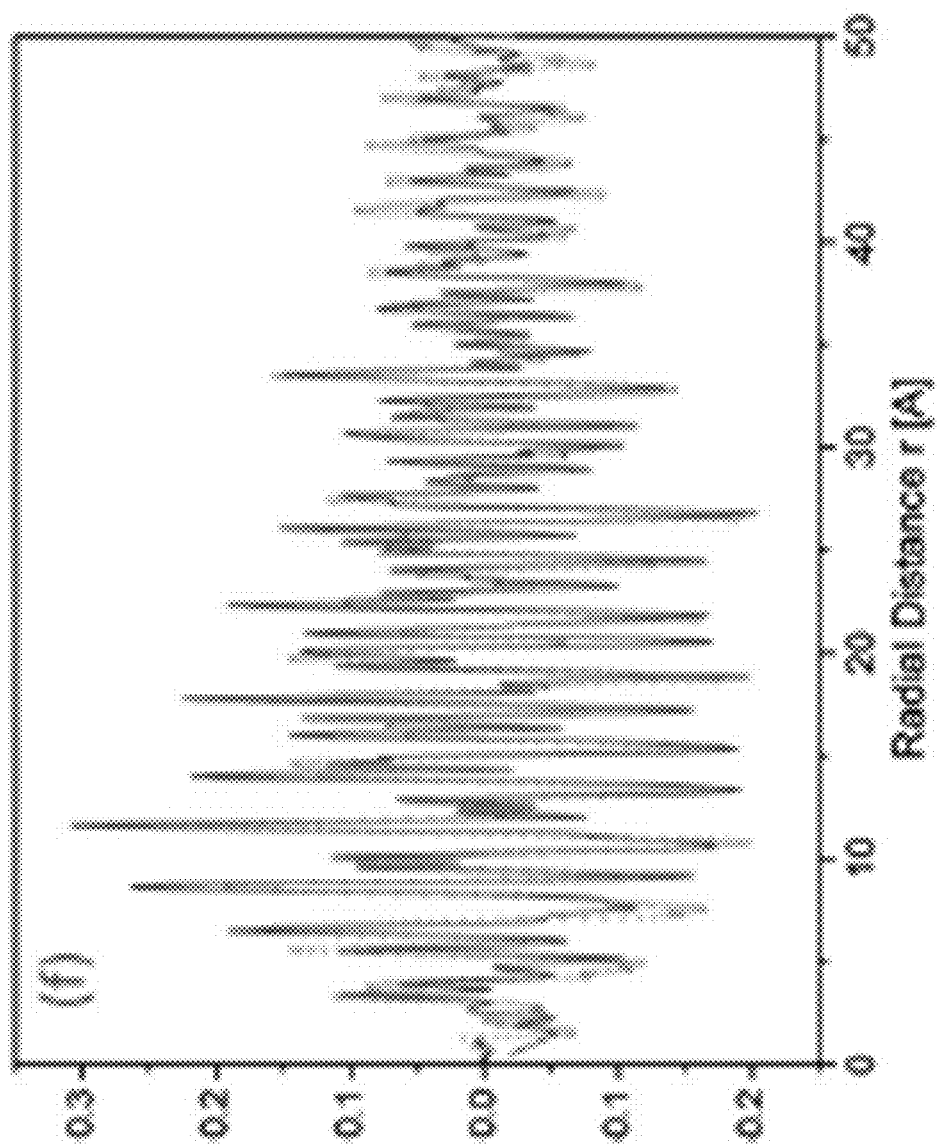

FIG. 6A shows the XRD pattern of the $Na_2Ti_6O_{13}$ (NTO) whiskers taken with Cu K$\alpha$ radiation, which allows a better resolution in reciprocal space. The data confirms that these whiskers crystallize in a monoclinic phase (JCPDS #460001). FIGS. 6B and 6C show the Cu K$\alpha$ XRD patterns of NBTBT whiskers synthesized topochemically at $800°$ C. and $900°$ C. and reveal the formation of a perovskite phase for these whiskers. However, a small impurity peak, marked with '*' in the XRD-pattern of the sample synthesized at $800°$ C., suggests more than 95% transformation occurs at this temperature. A magnified view of the $\{111\}_c$ and $\{200\}_c$ Bragg peaks for the sample processed at $900°$ C. is shown in the inset of FIG. 6C. The subscript c stands for the cubic crystal system. A small shoulder, appearing in the $\{111\}_c$ and $\{200\}_c$ peaks, indicates that the composition is near the MPB. In order to determine the structural type of the whiskers processed at $900°$ C., higher energy XRD patterns were recorded using Ag K$\alpha$ radiation as shown in FIG. 6D. This data was then reduced to an atomic pair distribution function (PDF) shown in FIG. 6E. The experimental PDF for the whiskers (see FIG. 6E) shows well defined peaks at high real space distances. The PDF peaks decay to zero at distances of about 10-15 nm, which may be considered to be the length of structural coherence, also known as the crystallite domain size, in this material. These XRD/PDF results indicate that the larger grains observed in these whiskers by SEM micrographs are made of relatively small size crystallites. Furthermore, the data in FIG. 6F shows that the PDF can be well fitted with a model based on the rhombohedral structure JCPDS (#850530) of the NBT perovskite confirming that the whiskers are a single phase ferroelectric material.

FIG. 7A shows the morphology of $Na_2Ti_6O_{13}$ whiskers prepared using the molten salt synthesis method at $1100°$ C. FIGS. 7B-D show the micrographs of the ferroelectric NBTBT whiskers synthesized at $700°$ C., $800°$ C. and $900°$ C., respectively. It can be clearly seen from these micrographs that, despite the structural transformation, the overall morphology of the whiskers is maintained up to $900°$ C. The length of the whiskers varies from 7.0-20 μm and the width varies from 0.30-1.0 μm. In embodiments, it is desired to obtain NBTBT whiskers with an aspect ratio ranging from greater than 1 to about 60. Preferred embodiments comprise NBTBT whiskers with an aspect ratio of 2-20, such as 5-10. Indeed, the dimensions and aspect ratios mentioned earlier in this specification with respect to the size of the seed templates (e.g., NBT seeds) are applicable to the size of the NTO whiskers as well and thus also corresponds with the size of the resulting NBTBT whiskers. The overall shape of the whiskers was maintained, even after reaction at varying high temperatures, but a noticeable change in the surface morphology was observed. For the sake of clarity, the magnified view of the surface morphologies of the whiskers treated at various temperatures is presented in FIGS. 8A-F. Note the effect of the reaction temperature on the surface morphology, which leads to development of nano-size grains at $900°$ C. As can be seen in this figure, the lead-free NBTBT whiskers processed at $900°$ C. (FIG. 8F) are composed of densely packed grains revealing their polycrystalline nature. However, this kind of grain growth in the sample processed at relatively low temperatures (<$900°$ C.) is not very obvious. Still, the surface clearly shows a change in morphology due to the diffusion of $Ba^{2+}$ and $Bi^{3+}$ during the reaction. NTO with tunnel structures have excellent ion exchange properties and the $Na^+$ atom can be easily replaced by $Ba^{2+}$ and $Bi^{3+}$. The presence of these ions with a higher positive charge further facilitates the structural transformation from NTO to lead-free NBTBT. The estimated grain size on the NBTBT whiskers after reaction at $900°$ C. was found to be in the range of 100-500 nm (FIG. 8F). In embodiments, the grains on the surface of the NBTBT can range in size from 10-1000 nm, for example. Preferred are grains ranging in size from about 50-750 nm, such as from 75-600 nm, or from 80-450 nm, and further for example from 125-300 nm, such as from 150-200 nm and so on. In order to analyze the local microstructure and identify the phase content at the various stages of thermal processing, HRTEM was performed.

The detailed mechanism of the microstructural change and transformation of the NTO host into the $ABO_3$-type NBTBT structure can be summarized as follows: when stoichiometric amounts of the starting materials are mixed with NaCl and heated to $800°$ C. and $900°$ C., the salt melts and the decomposing $BaCO_3$ and $Bi_2O_3$ provide $Ba^{2+}$ ions and $Bi^{3+}$ ions. These ions react with the host NTO matrix due to difference in the chemical potential, resulting in the formation of an $ABO_3$-type perovskite structure. NTO belongs to the $M_2Ti_nO_{2n+1}$ family of compounds, where n=6 or 3 and M=Na or K. It has a base-centered monoclinic structure with lattice parameters, a=1.51310 nm, b=0.37450 nm, c=0.91590 nm and $\beta=99.3°$ C. and is of space group C2/m. The NTO structure is a 3-D network of $TiO_6$ octahedra joined by corners and edges resulting in a zigzag structure with rectangular tunnels along the y-axis of the monoclinic lattice, where the sodium ions are located. On the other hand, the $ABO_3$ perovskite structure features a simple cubic lattice in which the octahedra shares only corners and the B cation is at the origin of the Bravais cell. In the present case, the A site is shared by $Na^+/Ba^{2+}/Bi^{3+}$ ions and the B site is occupied by $Ti^{4+}$. The transformation process of NTO to NBTBT can be rationalized as follows: (i) during the synthesis, $Ba^{2+}/Bi^{3+}$ diffuse into the host lattice of $Na_2Ti_6O_{13}$ through an ion exchange mechanism with $Na^+$, resulting in a rearrangement of the octahedra sharing scheme to minimize the energy and allow for a thermodynamically stable configuration. A schematic of the NTO-to-NBTBT transformation ($ABO_3$-type perovskite) is shown in FIG. 9A.

The mechanism of rearrangement of $Na_2Ti_6O_{13}$ into the $ABO_3$-type NBTBT structure can be understood as follows: the energy of the edge shared octahedral configuration is higher than that of the corner sharing configuration and, consequently, the edge sharing octahedra are driven into a more energetically favorable coupling scheme during the reaction. According to the model, during the reaction, octahedra with shared edges in $Na_2Ti_6O_{13}$ move in the {100} direction to achieve the corner sharing connection of the $ABO_3$-type structure. This rearrangement is shown schematically in step 2 of FIG. 9A.

The schematic representation of the $ABO_3$-type structure depicted in FIG. 9B shows the presence of $O^{2-}$-$T^{4+}$-$O^{2-}$ triples parallel to the x, y and z axes. Considering the $ABO_3$-type perovskite with no center of symmetry, under the application of an electric field along the z axis, the $O^{2-}$-$T^{4+}$-$O^{2-}$ chains parallel to the z axis get polarized without a significant effect on the chains parallel to the other two axes. The whisker polarized in the direction of the z axis imparts ferroelectricity to the system. Moreover, when the configuration of the A site cation suffers a distortion (i.e. the A site atom is displaced from its average position) during the displacement of the oxygen ions in the above process, the shape of the unit cell changes resulting in a piezoelectric effect.

Figure 11:
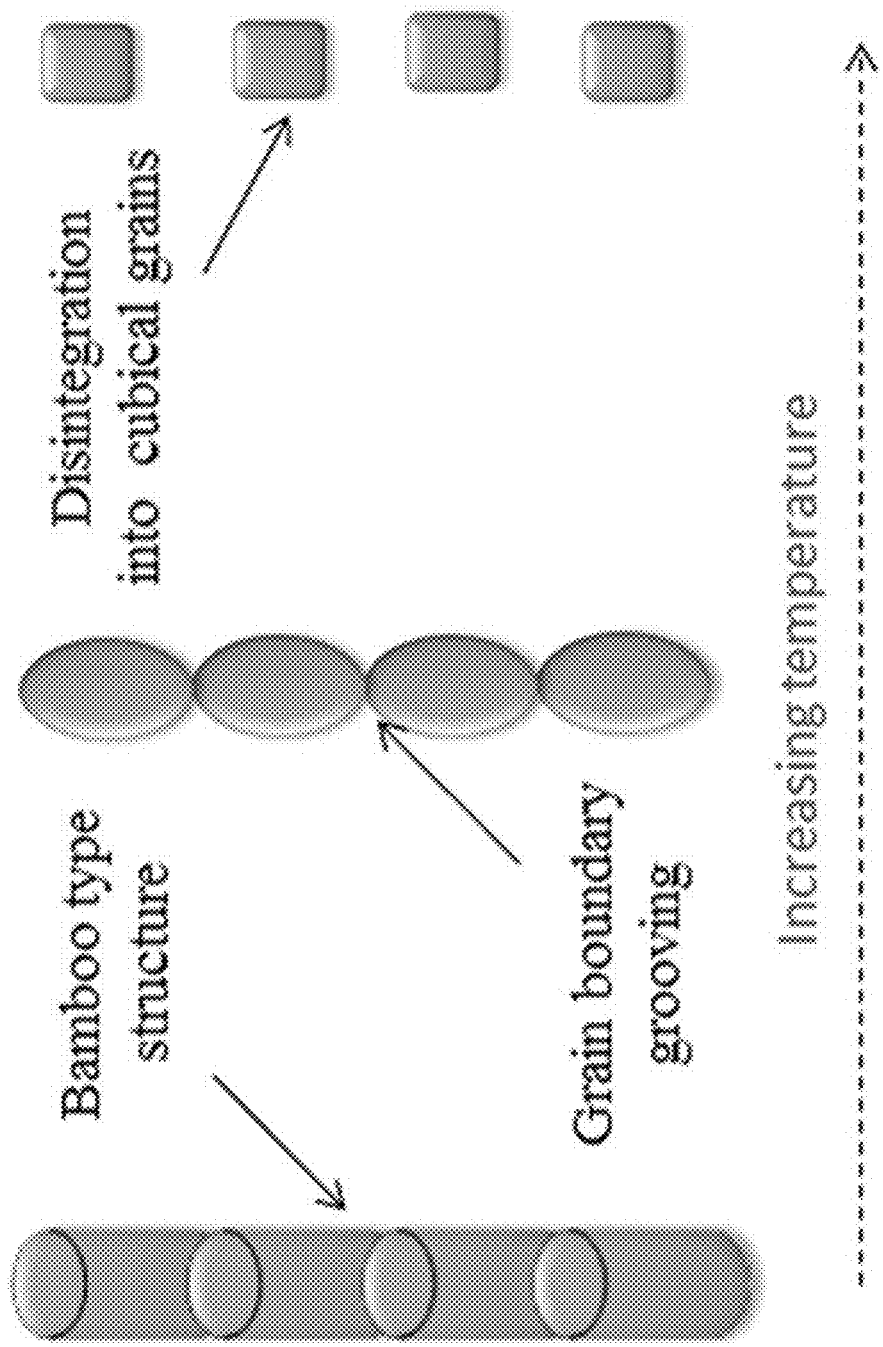
FIG. 11 is a schematic representation of the change in the morphology during disintegration of the NBTBT whisker with an increase in temperature.

To demonstrate the high temperature morphological transformation and the role of the surface and grain boundary energies, the NBTBT whiskers were dispersed on an alumina plate and subjected to heat treatment in air at various temperatures for 2 h (FIG. 10). Upon heat treatment at 1000° C. (FIG. 10A), coalescence occurred among the grains of the whiskers as the small grains (FIGS. 8E-F) that were observed at RT are no longer visible due to the high dihedral angles. A further increase in the temperature leads to the appearance of relatively large grains within the whiskers, which form a bamboo-type structure at 1100 and 1175° C. (FIGS. 10B and C). At 1175° C., the whisker starts to get thinner in the vicinity of the grain boundaries showing grain boundary grooving as a result of the surface/grain boundary diffusion and a local evaporation-condensation process (FIG. 10C). Upon further heating at 1200° C., the whiskers eventually disintegrate into individual grains, so that the grain boundary energy is minimized by thermal grooving; i.e., grain boundary grooving (FIG. 10D) to achieve an equilibrium cubical shape of the grain. The higher grain boundary energy leads to the disintegration of the whiskers to achieve the equilibrium cubical shape. Grain boundary grooving and Rayleigh-type instability could both lead to the disintegration of polycrystalline whisker with the bamboo-type structure, as both these mechanisms are driven by surface energy. However, in the present case, grain boundary grooving is considered to be the dominant mechanism. FIG. 11 depicts a schematic representation of the disintegration of lead-free NBTBT whiskers into isolated cubical grains. The polycrystalline whisker disintegrates into isolated cubic grains via grain boundary grooving and Rayleigh-type instability.

In conclusion, the reaction route previously described allows the topochemical conversion and structural rearrangement via translation of the edge shared octahedra of the starting NTO material, which leads to the formation of nanostructured $Na_{0.5}B_{0.5}TiO_3$—$BaTiO_3$ (NBTBT) ferroelectric whiskers. These whiskers have a rhombohedral-type average structure of the perovskite phase indicating their ferroelectric nature as confirmed by high energy X-ray diffraction coupled with pair distribution function (PDF) analysis and Raman scattering. High-resolution transmission microscopic (HRTEM) analysis reveals a local monoclinic structural distortion of the NBTBT whiskers suggesting the presence of a modulated structure at the nanoscale. Upon high temperature treatment, morphological changes take place resulting in breaking of the whiskers into individual grains as a consequence of a thermal grooving effect driven by minimization of the higher grain boundary energy. The lead-free NBTBT ferroelectric whiskers have potential applications in environmentally benign microelectronic devices.

Figure 12B:
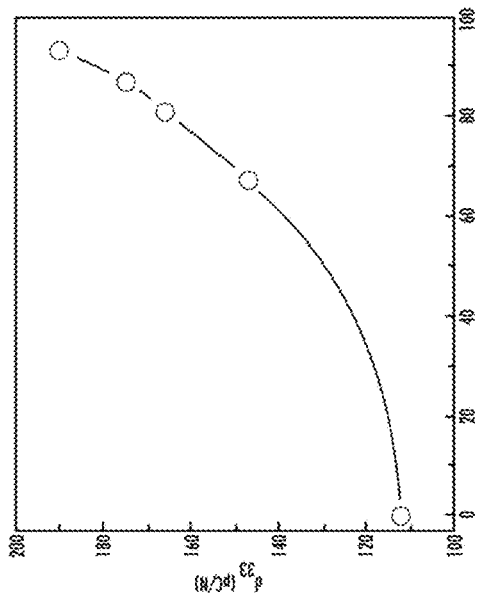
FIGS. 12A-D are (A) XRD patterns recorded at RT for various specimens having different degree of texturing, (B) Longitudinal piezoelectric constant as a function of degree of texturing, (C) XRD pole figure of (002) planes of 93% textured specimen, (D) Relative permittivity of versus temperature of poled KBT-BT-NBT specimen.
Figure 12D:
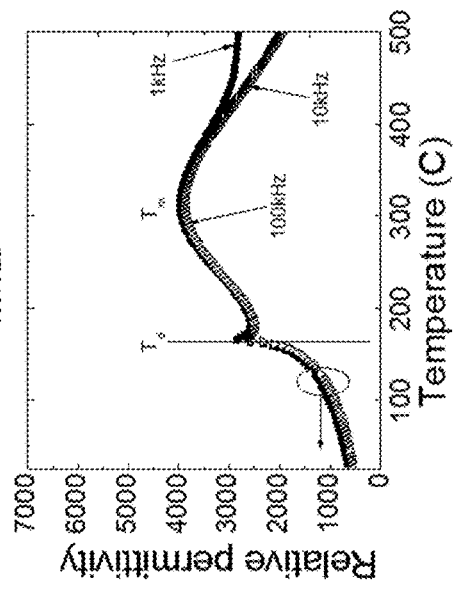
Figure 12A:
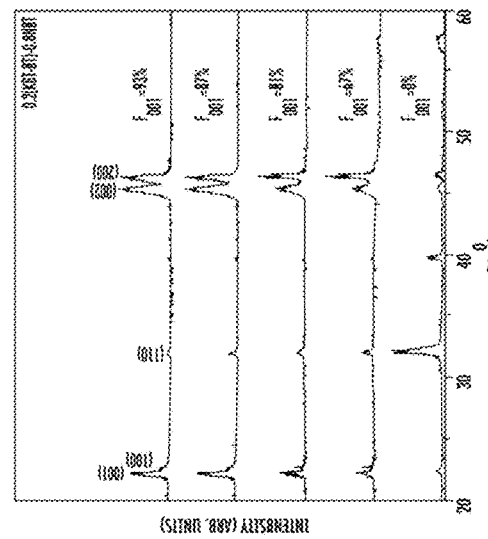
Figure 12C:
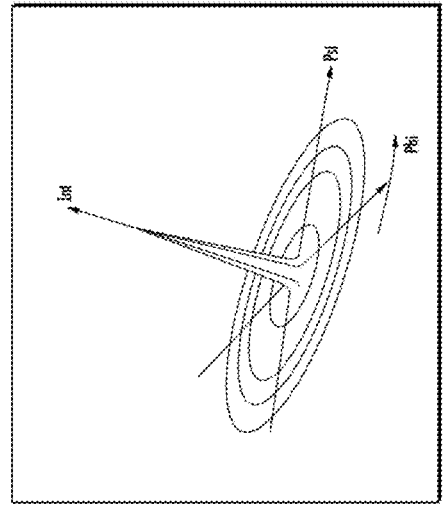

Example IV. Grain Oriented Lead-Free Piezoelectric KBT-BT-NBT Ceramics with Higher Temperature Stability The temperature stability of lead-free piezoelectric materials is a major concern. Most piezoelectric materials with high piezoelectric response are characterized by lower temperature stability as observed from lower Curie temperature (Tc) and depoling temperature (Td). The inventors have textured a lead-free piezoelectric system 0.2(K0.5Bi0.5TiO3-BaTiO3)-0.8N0.5B0.5TiO3 (KBT-BT-NBT) with KBT:BT=2:1 to achieve high temperature stability and enhanced piezoelectric response. In order to get high degree of texturing and piezoelectric response, the processing conditions were optimized. The plate type template crystallites were aligned in the powder matrix of KBT-BT-NBT system using tape casting method to get textured ceramic body at higher temperature. The XRD patterns were recorded on various specimens having different degree of texturing (FIG. 12A). An increase in the intensity of {100} and {200} peaks is observed showing increased texture in corresponding crystallographic orientation. The lotgering factor calculated for textured specimen was showing 93% maximum degree of texturing. In order to measure piezoelectric response, these samples were electrically poled at 5 kV/mm in silicone oil at 60° C. The values of longitudinal piezoelectric constant (d33) measured on specimen with various degree of texturing are plotted in FIG. 12B. The specimen having 93% texturing was found to show d33~190 pC/N. The XRD pole figure of (002) planes of 93% textured specimen is shown in FIG. 12C. The NBT based piezoelectric systems are generally characterized by depoling temperature (Td) above which the system gets depoled and loses piezoelectricity. Therefore, in order to get high temperature stability, the specimen should have Td as high as possible. In order to investigate depoling temperature of textured KBT-BT-NBT system, temperature dependence of relative permittivity plots were recorded on poled sample (FIG. 12D). From these plots, one can clearly observe high depoling temperature Td-165° C. These results show higher temperature stability (Td~165° C.) of our textured KBT-BT-NBT specimen with enhanced piezoelectric response (d33~190 pC/N).

The present invention has been described with reference to particular embodiments having various features. One skilled in the art will recognize that these features may be used singularly or in any combination based on the requirements and specifications of a given application or design. For example, with respect to particular methods disclosed herein it is understood that any one or more of the method steps can be omitted, added to another method, or performed in a different order than disclosed. Other embodiments of the invention will be apparent to those skilled in the art from consideration of the specification and practice of the invention. Where a range of values is provided in this specification, each value between the upper and lower limits of that range is also specifically disclosed. The upper and lower limits of these smaller ranges may independently be included or excluded in the range as well. All numbers and ranges disclosed above may vary by some amount. As used in this specification, the singular forms "a," "an," and "the" include plural referents unless the context clearly dictates otherwise. While compositions and methods are described in terms of "comprising," "containing," or "including" various components or steps, the compositions and methods can also "consist essentially of" or "consist of" the various components and steps. It is intended that the specification and examples be considered as exemplary in nature and that variations that do not depart from the essence of the invention are intended to be within the scope of the invention.

Further, the references cited in this disclosure are hereby incorporated by reference herein in their entireties, especially for information that is well known in the art for example with respect to compositions comprising, methods of using, and methods of preparing piezoelectric ceramics. For example, inventive products included within the scope of the invention include products identified previously if capable of being prepared according to a method disclosed herein. If there is any conflict in the usages of a word or term in this specification and one or more patent or other documents that may be incorporated herein by reference, definitions consistent with this specification should be adopted.

The invention claimed is:

1. A composition comprising a NBT-BT ceramic with NBT seeds oriented within the ceramic to a desired degree, wherein the NBT seeds have an aspect ratio of greater than 1, and wherein the composition has a degree of grain orientation that is greater than 90%.

2. The composition of claim 1, wherein the NBT seeds have an aspect ratio of 2-20.

3. The composition of claim 1, wherein the NBT-BT ceramic is formed from an NBT-BT matrix comprising an NBT:BT ratio of from 80:20 to 99:1.

4. The composition of claim 3, wherein the NBT is present in the matrix at about 93% and the BT in the matrix is present at about 7%.

5. The composition of claim 1, wherein the composition has a degree of grain orientation of about 92-99%.

6. The composition of claim 1, wherein the composition has a degree of grain orientation of about 93-98%.

7. The composition of claim 1, wherein the composition has a degree of grain orientation of about 94-96%.

8. The composition of claim 1, wherein the composition has a $d_{33}$ value of about 300-500.

9. The composition of claim 1, wherein the composition has a $d_{33}$ value of about 350-450.

10. The composition of claim 1, wherein the NBT seeds have an aspect ratio in the range of 2 to 50.

11. The composition of claim 1, wherein the NBT seeds have an aspect ratio in the range of 2 to 10.

12. The composition of claim 1, wherein the NBT seeds have an aspect ratio in the range of 5 to 20.

13. The composition of claim 1, wherein the aspect ratio is in the range of greater than 1 to 60.

14. The composition of claim 1, wherein the aspect ratio is in the range of 5 to 10.

15. The composition of claim 1, wherein the NBT-BT ceramic has the formula $(Na_{0.5}Bi_{0.5}TiO3)_{(1-x)}$—$(BaTiO_3)_x$ where x is 0.05, 0.6, 0.7, or 0.08.

* * * * *